(12) United States Patent
Chen et al.

(10) Patent No.: US 9,093,503 B1
(45) Date of Patent: Jul. 28, 2015

(54) SEMICONDUCTOR CHIP WITH A DUAL DAMASCENE WIRE AND THROUGH-SUBSTRATE VIA (TSV) STRUCTURE

(71) Applicant: International Business Machines Corporation, Armonk, NY (US)

(72) Inventors: Fen Chen, Williston, VT (US); Mukta G. Farooq, Hopewell Junction, NY (US); Jeffrey P. Gambino, Westford, VT (US); Zhong-Xiang He, Essex Junction, VT (US); Kevin S. Petrarca, Newburgh, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 14/146,788

(22) Filed: Jan. 3, 2014

(51) Int. Cl.
*H01L 23/522* (2006.01)
*H01L 21/768* (2006.01)

(52) U.S. Cl.
CPC .... *H01L 21/76879* (2013.01); *H01L 21/76807* (2013.01); *H01L 23/5226* (2013.01)

(58) Field of Classification Search
CPC .................................................. H01L 23/5226
See application file for complete search history.

(56) References Cited

U.S. PATENT DOCUMENTS

| | | | |
|---|---|---|---|
| 7,250,683 B2 | 7/2007 | Tsai et al. | |
| 7,633,165 B2 | 12/2009 | Hsu et al. | |
| 7,799,678 B2 * | 9/2010 | Kropewnicki et al. | 438/667 |
| 7,884,013 B2 | 2/2011 | Tseng et al. | |
| 8,043,968 B2 | 10/2011 | Cui et al. | |
| 8,344,512 B2 | 1/2013 | Knickerbocker | |
| 8,487,410 B2 | 7/2013 | Yu et al. | |
| 2004/0238870 A1 * | 12/2004 | Nakashima | 257/303 |
| 2005/0093163 A1 * | 5/2005 | Ho et al. | 257/762 |
| 2011/0068466 A1 * | 3/2011 | Chen et al. | 257/737 |

(Continued)

FOREIGN PATENT DOCUMENTS

| JP | 2011-119426 A | 6/2011 |
|---|---|---|
| KR | 10-1158392 B1 | 6/2012 |

OTHER PUBLICATIONS

Tominaga, et al., "Hybrid e-CMP/CMP Process for Cu Dual Damascene TSV Interconnects by Using non-Contact Electrode e-CMP Pad," International Conference on Planarization/CMP Technology, Nov. 19-21, 2009 Fukuoka, pp. 467-472.

(Continued)

*Primary Examiner* — Lex Malsawma
(74) *Attorney, Agent, or Firm* — Gibb & Riley, LLC; Anthony J. Canale

(57) ABSTRACT

Disclosed is a semiconductor chip having a dual damascene insulated wire and insulated through-substrate via (TSV) structure and methods of forming the chip. The methods incorporate a dual damascene technique wherein a trench and via opening are formed in dielectric layers above a substrate such that the trench is above a first via and the via opening is positioned adjacent to the first via and extends vertically from the trench and into the substrate. Dielectric spacers are formed on the sidewalls of the trench and via opening. A metal layer is deposited to form an insulated wire in the trench and an insulated TSV in the via opening. Thus, the insulated wire electrically connects the insulated TSV to the first via and, thereby to an on-chip device or lower metal level wire below. Subsequently, the substrate is thinned to expose the insulated TSV at the bottom surface of the substrate.

14 Claims, 20 Drawing Sheets

(56) References Cited

U.S. PATENT DOCUMENTS

| | | | | |
|---|---|---|---|---|
| 2011/0254165 | A1* | 10/2011 | Muranaka | 257/751 |
| 2011/0318923 | A1* | 12/2011 | Park et al. | 438/675 |
| 2013/0001783 | A1* | 1/2013 | Yu et al. | 257/751 |
| 2013/0285125 | A1* | 10/2013 | Chen et al. | 257/288 |
| 2013/0307160 | A1* | 11/2013 | Farooq et al. | 257/774 |
| 2014/0131884 | A1* | 5/2014 | Lin et al. | 257/774 |
| 2014/0138848 | A1* | 5/2014 | Matsuura | 257/774 |

OTHER PUBLICATIONS

El Farhane, et al., "A Successful Implementation of Dual Damascene Architecture to Copper TSV for 3D High Density Applications," IEEE International, 3D Systems Integration Conference (DIC), Nov. 16-18, 2010, 4 pages.

de Orio, et al, "Electromigration failure in a copper dual-damascene structure with a through silicon via," Microelectronics Reliability 52, 2012, pp. 1981-1986.

\* cited by examiner

SEMICONDUCTOR CHIP WITH A DUAL DAMASCENE WIRE AND THROUGH-SUBSTRATE VIA (TSV) STRUCTURE

BACKGROUND

The methods and structures disclosed herein relate to through-substrate vias (TSVs) for interconnecting chips in stacked-chip modules and, more particularly, to a method of forming a semiconductor chip with a dual damascene insulated wire and insulated TSV.

Stacked-chip modules (also referred to herein as stacked-chip packages, three-dimensional (3D) chip stacks or 3D multi-chip modules) have been developed to reduce form factor, interface latency and power consumption and to further increase in bandwidth. These benefits stem from the fact that, within a stacked-chip module, signals are passed through the chips using simple wire-based interconnects (e.g., through-substrate vias (TSVs) and micro-controlled collapsed chip connections (C4 connections)). TSVs are typically formed during back end of the line (BEOL) processing using a single damascene technique. Once the TSVs are formed, additional BEOL processing is performed to electrically connect the TSVs to on-chip devices. The BEOL processing steps used to form TSVs and subsequently electrically connect the TSVs to on-chip devices can be time-consuming and costly.

SUMMARY

In view of the foregoing, disclosed herein is a semiconductor chip having a dual damascene insulated wire and insulated through-substrate via (TSV) structure, which allows for integration into a stacked-chip module (i.e., into a three-dimensional (3D) chip stack). Also disclosed herein are methods of forming such a semiconductor chip. Specifically, the methods incorporate a dual damascene technique wherein a trench and via opening are formed in dielectric layers above a semiconductor substrate such that the trench is above a first via (e.g., to an on-chip device or lower metal level wire) and the via opening is positioned laterally adjacent to the first via and extends vertically from the bottom surface of the trench and into the semiconductor substrate to some predetermined depth. Dielectric spacers are formed on the vertical sidewalls of the trench and via opening. Then, a metal layer is deposited in order to simultaneously form an insulated wire in the trench and an insulated second via and, particularly, an insulated through-substrate via (TSV) in the via opening aligned below the trench. Thus, the insulated wire electrically connects the insulated TSV to the first via and, thereby to an on-chip device or lower metal level wire below. Additional back end of the line (BEOL) processing can be performed to complete the dual damascene structure and the semiconductor chip. This additional BEOL processing can comprise, for example, forming upper metal level vias and/or wires, forming solder pad(s) for controlled collapsed chip connection(s) (C4-connection(s)), thinning the semiconductor substrate to expose the insulated TSV at the bottom surface, etc. By using such a dual damascene technique the costs and processing times associated with insulated TSV formation and, thereby semiconductor chip formation can be reduced.

More particularly, disclosed herein is a semiconductor chip having a dual damascene insulated wire and insulated through-substrate via (TSV) structure in order to for integration into a stacked-chip module (i.e., for integration into a three-dimensional (3D) chip stack. The semiconductor chip can comprise a semiconductor substrate having a bottom surface. The semiconductor chip can further comprise a first dielectric layer above the semiconductor substrate and, particularly, above a top surface of the semiconductor substrate opposite the bottom surface. A first via can extend vertically through the first dielectric layer (e.g., to a lower metal level wire or to a semiconductor device on the top surface of the semiconductor substrate) and a second dielectric layer can be positioned above the first dielectric layer.

The semiconductor chip can further comprise a dual damascene structure. This dual damascene structure can comprise a trench, which extends vertically through the second dielectric layer to the first via and which is relatively wide as compared to the first via, and a via opening that is offset from the first via and that extends vertically from the bottom surface of the trench through the bottom surface of the semiconductor substrate. Dielectric spacers can be positioned laterally adjacent to and can cover the vertical sidewalls of both the via opening and the trench within the dual damascene structure from the bottom surface of the semiconductor substrate to the top surface of the second dielectric layer. A single metal layer can fill the via opening so as to form an insulated second via and, particularly, the insulated TSV. This same metal layer can further fill the trench so as to form the insulated wire, which electrically connects the first via and the insulated second via (i.e., to the insulated TSV).

Generally, disclosed herein are methods of forming a semiconductor chip having a dual damascene insulated wire and insulated through-substrate via (TSV) structure. The method can comprise providing a semiconductor substrate having a bottom surface. A first dielectric layer can be formed above semiconductor substrate and, particularly, above a top surface of the semiconductor substrate opposite the bottom surface and a first via can be formed that extends vertically through the first dielectric layer (e.g., to either a lower metal level wire or to a semiconductor device on the top surface of the semiconductor substrate). After the first via is formed, a second dielectric layer can be formed above the first dielectric layer.

Next, the method can comprise forming the dual damascene structure comprising the insulated wire and an insulated second via and, particularly, the insulated through-substrate via (TSV). Specifically, this dual damascene structure can be formed such that the insulated wire is in the second dielectric layer and electrically connects the first via and the insulated second via and such that the insulated second via extends vertically from the insulated wire into the semiconductor structure to some predetermined depth.

To form such a dual damascene structure, a trench and a via opening can each be formed (e.g., using conventional lithographic patterning and etch techniques). The trench can be patterned and etched such that it extends vertically through the second dielectric layer to the first via and such that it is relatively wide as compared to the first via. The via opening can be patterned and etched such that it is offset from the first via and further such that it extends vertically from the bottom surface of the trench and into the semiconductor substrate to the predetermined depth. Once the trench and via opening are formed, dielectric spacers can be formed on the vertical sidewalls of the via opening and the trench. Specifically, the dielectric spacers can be formed such that they are positioned laterally adjacent to and covering the vertical sidewalls of both the via opening and the trench from the bottom surface of the semiconductor substrate to the top surface of the second dielectric layer. After the dielectric spacers are formed, a metal layer can be deposited (e.g., using conventional electrodeposition techniques) so as to simultaneously fill the via opening and the trench, thereby forming the insulated second via (i.e., the insulated TSV) and the insulated wire, which electrically connects the first via and the insulated second via.

Additional back end of the line (BEOL) processing can then be performed to complete the dual damascene structure and the semiconductor chip. The additional BEOL processing can comprise, for example, forming upper metal level via and/or wires, forming solder pad(s) for controlled collapsed chip connection(s) (C4-connection(s)), thinning the semiconductor substrate to expose the insulated TSV at the bottom surface, etc.

One specific method of forming a semiconductor chip having a dual damascene insulated wire and insulated through-substrate via (TSV) structure can comprise providing a semiconductor substrate having a bottom surface. After middle of the line (MOL) processing (e.g., device formation, pre-metal dielectric formation, and device contact formation), multiple lower metal levels, including at least one lower metal level wire, can be formed in a stack of lower inter-metal level dielectric layers above the semiconductor substrate and, particularly, above the pre-metal level dielectric layer.

A first upper intra-metal dielectric layer can be formed on the stack and a first via can be formed that extends vertically through the first upper intra-metal dielectric layer to the lower metal level wire within the stack below. After the first via is formed, a second upper intra-metal dielectric layer can be formed above the first upper intra-metal dielectric layer.

Next, this method can comprise forming a dual damascene structure comprising an insulated wire and an insulated second via and, particularly, an insulated through-substrate via (TSV). Specifically, this dual damascene structure can be formed such that the insulated wire is in the second upper intra-metal dielectric layer and electrically connects the first via and the insulated second via (i.e., the insulated TSV) and such that the insulated second via extends vertically from the insulated wire to the bottom surface of the semiconductor substrate.

To form such a dual damascene structure, a trench and a via opening can each be formed (e.g., using conventional lithographic patterning and etching techniques). The trench can be patterned and etched such that it extends vertically through the second upper intra-metal dielectric layer to the first via and such that it is relatively wide as compared to the first via. The via opening can be patterned and etched such that it is offset from the first via and further such that it extends vertically from the bottom surface of the trench to the bottom surface of the semiconductor substrate. Once the trench and via opening are formed, dielectric spacers can be formed on the vertical sidewalls of the via opening and the trench. Specifically, the dielectric spacers can be formed such that they are positioned laterally adjacent to and cover the vertical sidewalls of both the via opening and the trench from the bottom surface of the semiconductor substrate to the top surface of the second upper intra-metal dielectric layer. After the dielectric spacers are formed, a metal layer can be deposited (e.g., using conventional electrodeposition techniques) so as to simultaneously fill the via opening and the trench, thereby forming the insulated second via (i.e., the insulated TSV) and the insulated wire, which electrically connects the first via and the insulted second via.

Additional back end of the line (BEOL) processing can then be performed to complete the dual damascene structure and the semiconductor chip.

The additional BEOL processing can comprise, for example, forming a third upper inter-metal level dielectric layer on the second upper inter-metal level dielectric layer above the dual damascene structure and forming a third via that extends vertically through the third upper inter-metal level dielectric layer to the insulated wire. Depending upon the metal level of the third upper inter-metal level dielectric layer, an upper metal level wire can be formed on the third upper inter-metal level dielectric layer immediately adjacent to the third via. Formation of this upper metal level wire can be followed by additional upper metal level via and/or wire formation, if necessary, and solder pad formation for controlled collapsed chip connections (C4 connections). Alternatively, if no additional upper metal level vias and/or wires are required, a solder pad for a controlled collapsed chip connection (C4 connection) can be formed on the third upper inter-metal level dielectric layer immediately adjacent to the third via.

The additional BEOL processing can further comprise thinning the semiconductor substrate to expose the insulated TSV at the bottom surface, forming an insulator layer on the bottom surface, forming an opening in the insulator layer aligned with the insulated TSV, forming a contact pad at the opening immediately adjacent to the insulated TSV, etc.

BRIEF DESCRIPTION OF THE DRAWINGS

The structures and methods disclosed herein will be better understood from the following detailed description with reference to the drawings, which are not necessarily drawn to scale and in which.

DETAILED DESCRIPTION

As mentioned above, stacked-chip modules (also referred to herein as stacked-chip packages, three-dimensional (3D) chip stacks or 3D multi-chip modules) have been developed to reduce form factor, interface latency and power consumption and to further increase in bandwidth. These benefits stem from the fact that, within a stacked-chip module, signals are passed through the chips using simple wire-based interconnects (e.g., through-substrate vias (TSVs) and micro-controlled collapsed chip connections (C4 connections)). TSVs are typically formed during back end of the line (BEOL) processing using a single damascene technique. Once the TSVs are formed, additional BEOL processing is performed to electrically connect the TSVs to on-chip devices. The BEOL processing steps used to form TSVs and subsequently electrically connect the TSVs to on-chip devices can be time-consuming and costly.

In view of the foregoing, disclosed herein is a semiconductor chip having a dual damascene insulated wire and insulated through-substrate via (TSV) structure, which allows for integration into a stacked-chip module (i.e., into a three-dimensional (3D) chip stack). Also disclosed herein are methods of forming such a semiconductor chip. Specifically, the methods incorporate a dual damascene technique wherein a trench and via opening are formed in dielectric layers above a semiconductor substrate such that the trench is above a first via (e.g., to an on-chip device or lower metal level wire) and the via opening is positioned laterally adjacent to the first via and extends vertically from the bottom surface of the trench and into the semiconductor substrate. Dielectric spacers are formed on the vertical sidewalls of the trench and via opening. Then, a metal layer is deposited in order to simultaneously form an insulated wire in the trench and an insulated second via and, particularly, an insulated through-substrate via (TSV) in the via opening aligned below the trench. Thus, the insulated wire electrically connects the insulated TSV to the first via and, thereby to an on-chip device or lower metal level wire below. Additional back end of the line (BEOL) processing can be performed to complete the dual damascene structure and the semiconductor chip. This additional BEOL processing can comprise, for example, forming upper metal level vias and/or wires, forming solder pad(s) for controlled collapsed chip connection(s) (C4-connection(s)), thinning the semiconductor substrate to expose the insulated TSV at the bottom surface, etc. By using such a dual damascene technique the costs and processing times associated with insulated TSV formation and, thereby semiconductor chip formation can be reduced.

Figure 1A:
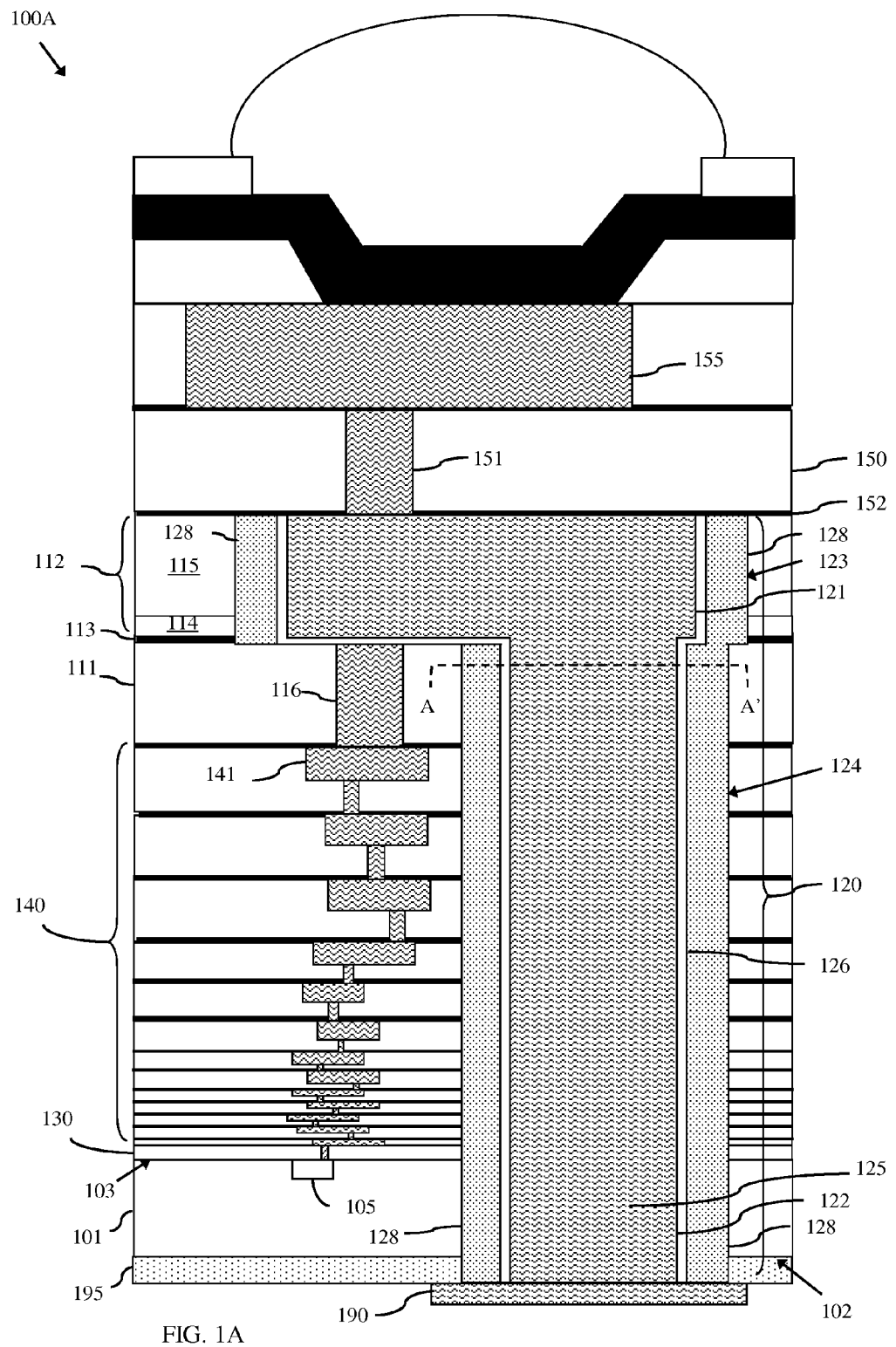
FIG. 1A is a cross-section diagram illustrating a semiconductor chip having a dual damascene insulated wire and insulated through-substrate via (TSV) structure.
Figure 1B:
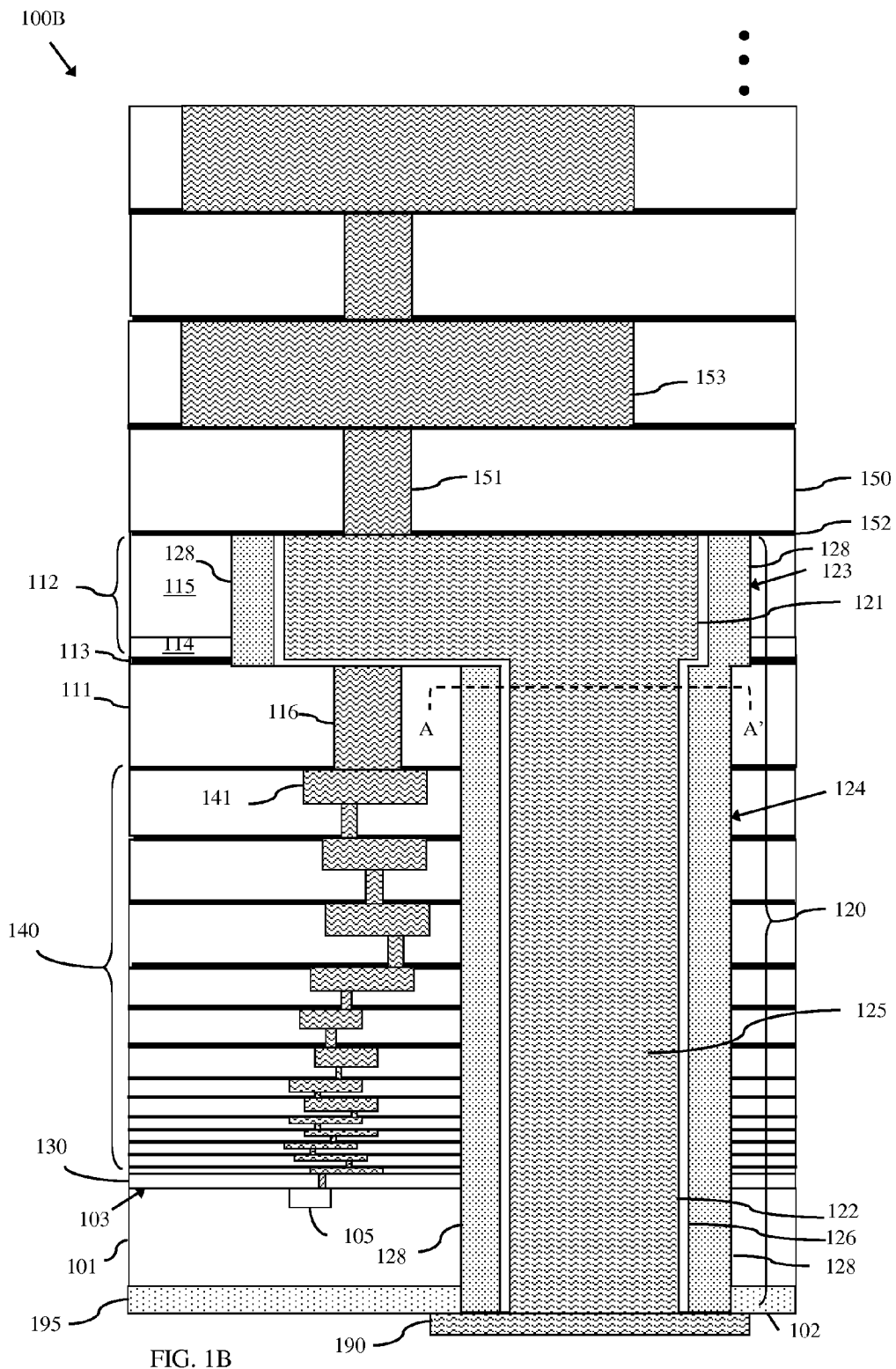
FIG. 1B is a cross-section diagram illustrating another semiconductor chip having a dual damascene insulated wire and insulated through-substrate via (TSV) structure.
Figure 1C:
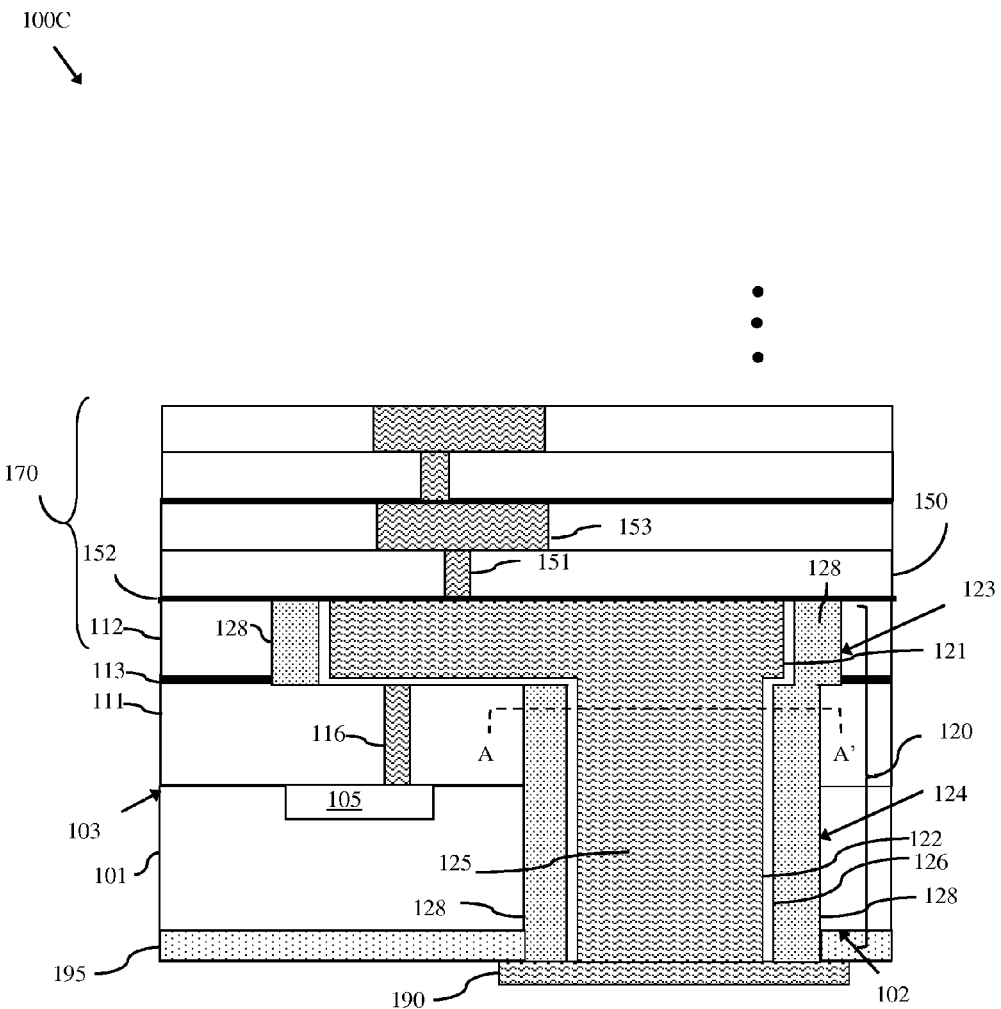
FIG. 1C is a cross-section diagram illustrating yet another semiconductor chip having a dual damascene insulated wire and insulated through-substrate via (TSV) structure.

More particularly, referring to FIGS. 1A-1C, disclosed herein is a semiconductor chip 100A, 100B, 100C having a dual damascene insulated wire and insulated through-substrate via (TSV) structure 120, which allows for integration into a stacked-chip module (i.e., for integration into a three-dimensional (3D) chip stack). The semiconductor chip 100A, 100B, 100C can comprise a semiconductor substrate 101 having a bottom surface 102 and a top surface 103 opposite the bottom surface. For purposes of this illustration, the semiconductor substrate 101 is shown as a bulk semiconductor substrate (e.g., a bulk silicon (Si) substrate). However, it should be understood that, alternatively, this semiconductor substrate can comprise a semiconductor-on-insulator (SOI) substrate (e.g., a silicon-on-insulator substrate) or any other suitable type of semiconductor substrate.

The semiconductor chip 100A, 100B, 100C can comprise one or more semiconductor devices 105 (e.g., field effect transistors, bipolar transistors, capacitors, or any other type of semiconductor device) at the top surface 103 of the semiconductor substrate 101.

The semiconductor chip 100A, 100B, 100C can further comprise a first dielectric layer 111 above the semiconductor substrate 101 and, particularly, above the top surface 103 of the semiconductor substrate 101 opposite the bottom surface 102. A first via 116 can extend vertically through the first dielectric layer 111 and, as discussed in greater detail below, can land either on a lower metal level wire 141 (as shown in the semiconductor chips 100A and 100B of FIGS. 1A and 1B, respectively) or on an on-chip semiconductor device 105 (as shown in the semiconductor chip 100C of FIG. 1C). In any case, the first via 116 can comprise a via opening extending vertically through the first dielectric layer 111. This via opening can be filled with a metal layer (e.g., a copper (Cu) layer) and can, optionally, be lined with one or more of the following relatively thin conformal layers: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) seed layer, to the barrier layer) and a metal seed layer (e.g., a copper (Cu) seed layer) that facilitates electrodeposition of the metal layer that fills the first via 116.

A second dielectric layer 112 can be positioned above the first dielectric layer 111. Optionally, a relatively thin dielectric cap layer 113 (e.g., a silicon nitride (SiN) cap layer) can be stacked between the first dielectric layer 111 and the second dielectric layer 112.

The semiconductor chips 100A, 100B, 100C can further comprise a dual damascene structure 120. This dual damascene structure 120 can comprise an insulated second via 122 and, particularly, an insulated through-substrate via (TSV), and an insulated wire 121 that electrically connects the first via 116 to the insulated second via 122.

Specifically, this dual damascene structure 120 can comprise a trench 123, which extends vertically through the second dielectric layer 112 and, if applicable, the dielectric cap layer 113, to the first via 116 and which is relatively wide as compared to the first via 116. The dual damascene structure 120 can further comprise a via opening 124 that is offset from the first via 116 (e.g., that is parallel to and physically separated from the first via 116) and that extends vertically from the bottom surface of the trench 123 through the first dielectric layer 111, through any other dielectric layer(s) between the semiconductor substrate 101 and the first dielectric layer 111 and completely through the semiconductor substrate 101 (i.e., to the bottom surface 102 of the semiconductor substrate 101).

Dielectric spacers 128 can be positioned laterally adjacent to and can cover the vertical sidewalls of both the second via opening 124 and the trench 123 within the dual damascene structure 120 from the bottom surface 102 of the semiconductor substrate 101 to the top surface of the second dielectric layer 112. These dielectric spacers 128 can comprise, for example, silicon dioxide ($SiO_2$), spacers, silicon nitride (SiN) spacers, silicon oxynitride (SiON) spacers, or any other dielectric spacer suitable for wire and via insulation.

A single metal layer 125 (e.g., a copper (Cu) layer, a tungsten (W) layer, an aluminum (Al) layer, a cobalt (Co) layer, a gold (Au) layer, a silver (Ag) layer or any other suitable metal layer) can fill the via opening 124 and trench 123 so as to form the insulated second via 122 (i.e., the insulated TSV) and the insulated wire 121, which electrically connects the first via 116 and the insulated second via 122. Optionally, the trench 123 and via opening 124 with the dielectric spacers 128 can be lined with one or more relatively thin conformal layers 126 such that these layers are positioned laterally between the metal layer 125 and the dielectric spacers 128 within both the trench 123 and via opening 124 and further positioned between the metal layer 125 and exposed horizontal surfaces of the first via 116 and first dielectric layer 111 within the trench 123. The conformal layers 126 can comprise, for example, any of the following: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) outdiffusion, tungsten (W) outdiffusion, etc.), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) seed layer, tungsten (W) seed layer, etc., to the barrier layer) and a metal seed layer (e.g., a copper (Cu) seed layer, a tungsten (W) seed layer or any other suitable metal seed layer) that facilitates electrodeposition of the metal layer 125 that fills the trench 123 and via opening 124.

As mentioned above, the first via 116 can land on a lower metal level wire 141 (as shown in FIGS. 1A and 1B). More specifically, referring to the semiconductor chip 100A of FIG. 1A and 100B of FIG. 1B, the first dielectric layer 111 and the second dielectric layer 112 can comprise upper metal level inter-metal level dielectric layers (i.e., a first upper inter-metal level dielectric layer and a second upper inter-metal level dielectric) above a pre-metal level dielectric layer 130 and further above multiple lower metal levels, including at least one lower metal level wire 141, in a stack 140 of lower inter-metal level dielectric layers. For purposes of this disclosure, a pre-metal level dielectric layer refers to a below metal level dielectric layer that isolates metal level wires from the devices 105 on the semiconductor substrate 101. Such a pre-metal level dielectric layer 130 can comprise, for example, a silicon dioxide ($SiO_2$). For purposes of this disclosure, an inter-metal level dielectric (IMD) layer refers to a back end of the line (BEOL) dielectric layer, which is in a metal level above the semiconductor substrate 101 and which electrically isolates metal level vias and/or wires contained therein from other metal level vias and/or wires. The inter-metal level dielectric layers can comprise, for example, one or more layers of the following alone and/or in combination: silicon dioxide ($SiO_2$), a silicon nitride (SiN), borophosphosilicate glass (BPSG), tetraethyl orthosilicate (TEOS), fluorinated tetraethyl orthosilicate (FTEOS), etc. For example, the second upper inter-metal level dielectric layer can comprise a lower portion 114 comprising TEOS and an upper portion 115 above the lower portion and comprising FTEOS.

In any case, the first via 116 can extend vertically to the lower metal level wire 141 in the stack 140 below the first inter-metal level dielectric layer 111. An additional dielectric cap layer 152 (e.g., an additional silicon nitride (SiN) cap layer) can be above the second upper inter-metal level dielectric layer 112 and can extend laterally over the dual damascene structure 120. Additionally, a third upper inter-metal level dielectric layer 150 can be positioned on the additional dielectric cap layer 152 and a third via 151 can extend vertically through the third upper inter-metal level dielectric layer 150 and the additional dielectric cap layer 152 to the insulated wire 121. In this case, depending upon the level of the third upper inter-metal level dielectric layer 150, either a solder pad 155 (e.g., a metal pad, such as a copper (Cu) pad or any other suitable metal pad), as shown in the semiconductor chip 100A of FIG. 1A, or an upper metal level wire 153, as shown in the semiconductor chip 100B of FIG. 1B, can be positioned on the third upper inter-metal level dielectric layer 150 immediately adjacent to the third via 151. If an upper metal level wire 153 is positioned on the third via 151, as shown in FIG. 1, one or more additional upper metal level vias and/or wires can be positioned above the upper metal level wire 153 and solder pad(s) (not shown) for controlled collapsed chip connection(s) (C4 connections) can be positioned above the additional upper metal level vias and/or wires. Those skilled in the art will recognize that solder pad(s) above the metal levels will allow for electrical connections (e.g., controlled collapsed chip connections (C4 connections) to higher chips in a stacked-chip module.

Alternatively, the first via 116 can land on a semiconductor device 105 (as shown in FIG. 1C. More specifically, referring to the semiconductor chip 100C of FIG. 1C, the first dielectric layer 111 can comprise a pre-metal level dielectric layer. As mentioned above, for purposes of this disclosure, a pre-metal level dielectric layer refers to a below metal level dielectric layer that isolates metal level wires from the devices 105 on the semiconductor substrate 101. This pre-metal level dielectric layer can comprise, for example, silicon dioxide ($SiO_2$). In this case, the first via 116 can comprise a device contact that extends vertically to a device 105 on the semiconductor substrate 101 in order to electrically connect that device 105 to the wire 121 and, thereby to the second via 122. Further-more, the second dielectric layer 112 can comprise an initial inter-metal level dielectric layer in a stack 170 of inter-metal level dielectric layers for multiple metal levels above the pre-metal level dielectric layer and solder pad(s) (not shown) for controlled collapsed chip connection(s) (C4 connections), as discussed above, can be positioned above the metal levels.

Each of the semiconductor chips 100A, 100B, 100C can further comprise an insulator layer 195 (e.g., a silicon dioxide ($SiO_2$), layer, a silicon nitride (SiN) layer, a silicon oxynitride (SiON) layer or any other suitable insulator layer) on the bottom surface 102 of the semiconductor substrate 101, an opening in the insulator layer 195 aligned with the insulated second via 122 and a contact pad 190 (e.g., a metal pad, such as a copper pad or any other suitable metal pad) at the opening in the insulator layer 195 immediately adjacent to the insulated second via 122 (i.e., the insulated TSV) and, particularly, immediately adjacent to the metal layer 125 contained therein. Such a contact pad 190 can allow for electrical connection (e.g., controlled collapsed chip connection (C4 connection)) to a lower chip or chip-carrier in a stacked-chip module.

Figure 2A:
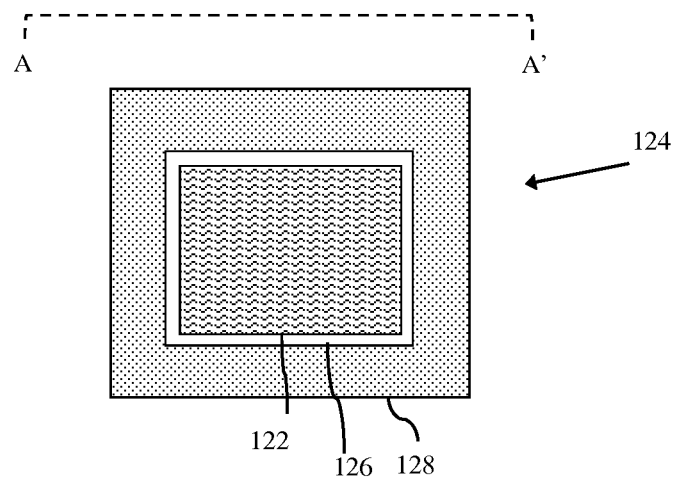
FIG. 2A is a cross-section diagram illustrating an insulated via having a rectangular shape.
Figure 2B:
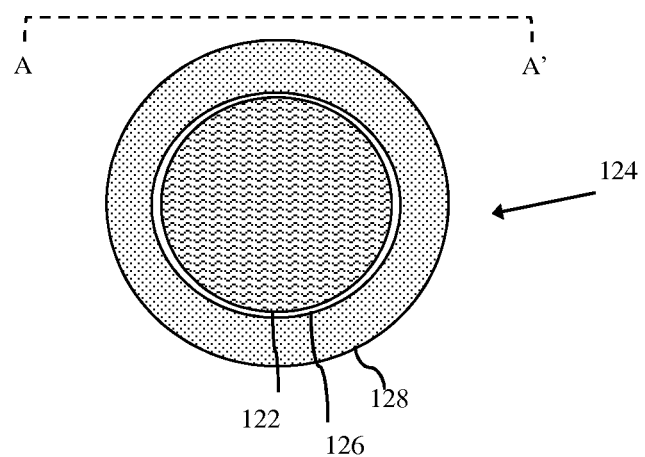
FIG. 2B is a cross-section diagram illustrating an insulated via having a circular shape.
Figure 3A:
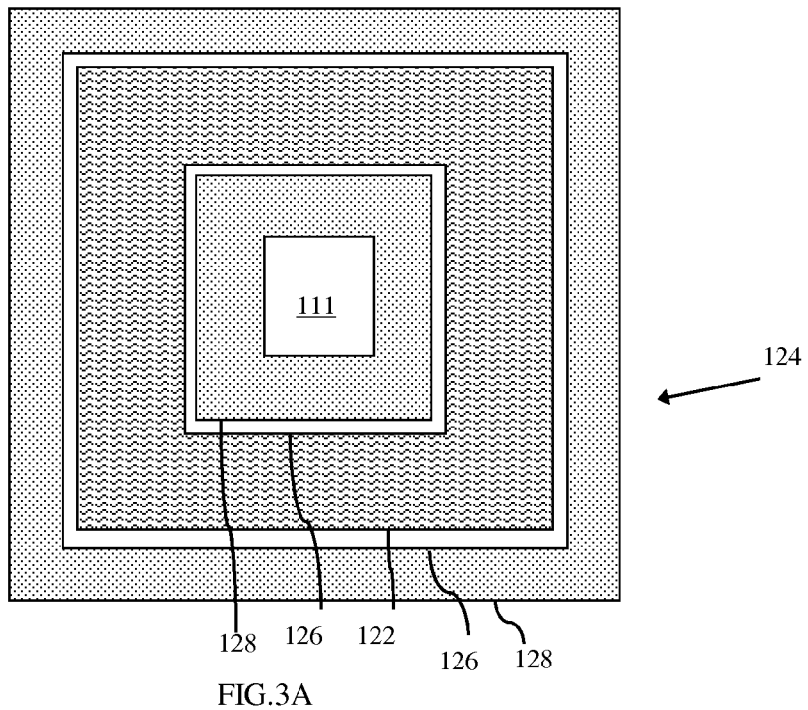
FIG. 3A is a cross-section diagram illustrating an insulated via having a rectangular-ring shape.
Figure 3B:
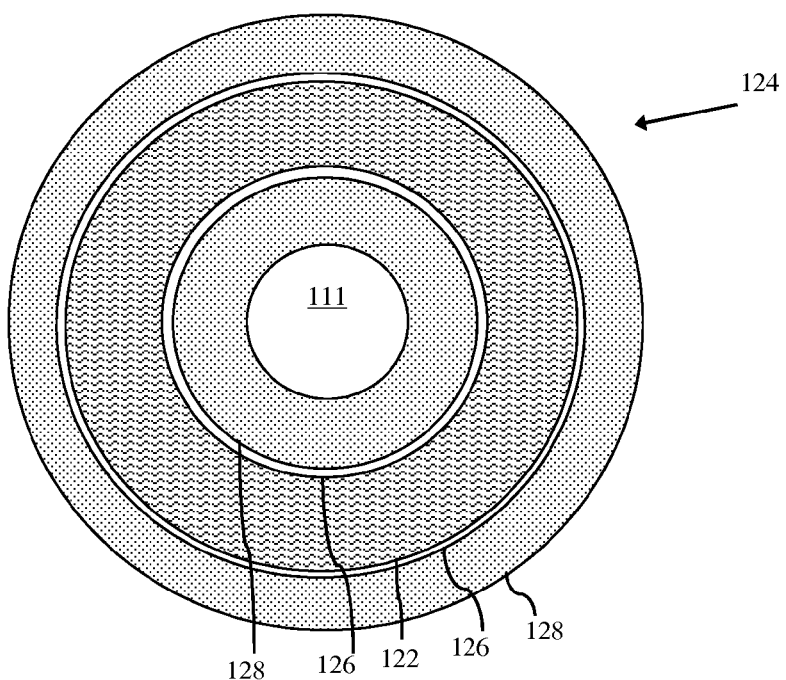
FIG. 3B is a cross-section diagram illustrating an insulated via having a circular-ring shape.

It should be noted that in each of the semiconductor chips 100A, 100B and 100C described above, the via opening 124 for the second via 122 can have a simple polygon shape, such as a rectangular shape (e.g., as shown in the horizontal cross-section A-A' of FIG. 2A) or a circular shape (e.g., as shown in the horizontal cross-section A-A' of FIG. 2B). Alternatively, although not fully illustrated in FIGS. 1A-1C, the via opening 124 for the second via 122 can have a ring shape that is annular with respect to a column of stacked dielectric dielectric and substrate materials, such as a rectangular ring shape (e.g., as shown in the horizontal cross-section of FIG. 3A) or a circular ring shape (e.g., as shown in the horizontal cross-section of FIG. 3B).

Figure 4:
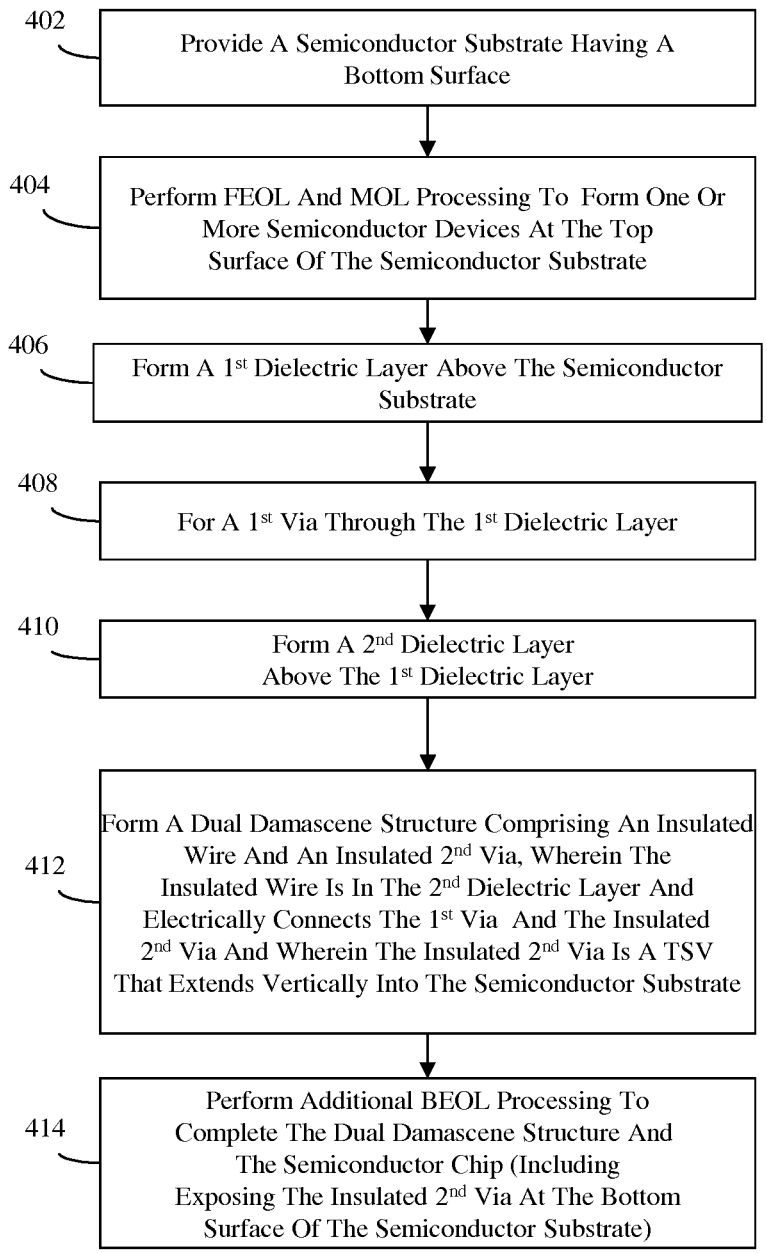
FIG. 4 is a flow diagram illustrating generally a method of forming a semiconductor chip having a dual damascene insulated wire and insulated TSV structure.

Generally, disclosed herein are methods of forming a semiconductor chip, such as the semiconductor chip 100A, 100B or 100C of FIGS. 1A, 1B and 1C, respectively, having a dual damascene wire and through-substrate via (TSV) structure 120, which allows for integration into a stacked-chip module (i.e., for integration into a three-dimensional (3D) chip stack). Referring to FIG. 4 in combination with FIGS. 1A, 1B and 1C, the method can comprise providing a semiconductor substrate 101 having a bottom surface 102 and a top surface 103 opposite the bottom surface (402). This semiconductor substrate 101 can comprise a bulk semiconductor substrate (e.g., a bulk silicon (Si) substrate) or, alternatively, can comprise a semiconductor-on-insulator (SOI) substrate (e.g., a silicon-on-insulator substrate) or any other suitable semiconductor substrate.

The method can further comprise performing front end of the line (FEOL) and middle of the line (MOL) processing so as to form one or more semiconductor devices 105 (e.g., field effect transistors, bipolar transistors, capacitors, or any other type of semiconductor device) at the top surface 103 of the semiconductor substrate 101 (404).

Subsequently, the method can comprise forming (e.g., depositing) a first dielectric layer 111 above the semiconductor substrate 101 and, particularly, above the top surface 103 of the semiconductor substrate 101 opposite the bottom surface 102 (406).

Next, a first via 116 can be formed that extends vertically through the first dielectric layer 111 (408). Specifically, this first via 116 can be formed by first using, for example, conventional lithographic patterning and etch techniques to form a via opening that extends vertically through the first dielectric layer 111. This via opening can be filled with a metal layer (e.g., a copper (Cu) layer) using, for example, an electrodeposition process. Optionally, prior to the metal layer electrodeposition process, this via opening can be lined with one or more of the following conformal layers: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) seed layer, to the barrier layer) and a metal seed layer (e.g., a copper (Cu) seed layer) that facilitates electrodeposition of the metal layer that fills the first via 116. As discussed in greater detail below, depending upon the semiconductor chip being formed (i.e., 100A, 100B, or 100C), the first via 116 can land on either a lower metal level wire 141, as shown in FIGS. 1A and 1B, or a semiconductor device 105, as shown in FIG. 1C.

After the first via 116 is formed, an optional dielectric cap layer 113 (e.g., a silicon nitride (SiN) layer) and a second dielectric layer 112 can be formed (e.g., deposited) above the first dielectric layer 111 (410).

The method can further comprise forming a dual damascene structure 120 comprising an insulated wire 121 in the second dielectric layer 112 and an insulated second via 122 and, particularly, an insulated through-substrate via (TSV) that extends vertically from the insulated wire 121 to the bottom surface 102 of the semiconductor substrate 101 (412).

This process 412 of forming the dual damascene structure 120 can comprise, using conventional lithographic patterning and etching processes, to form a trench 123, which extends vertically through the second dielectric layer 112 to the first via 116 and which is relatively wide as compared to the first via 116, and to further form a via opening 124 that is offset from the first via 116 (e.g., that is parallel to and physically separated from the first via 116) and that extends vertically from the bottom surface of the trench 123 through the first dielectric layer 111, through any other dielectric layer(s) between the semiconductor substrate 101 and the first dielectric layer 111 and into the semiconductor substrate 101 to some predetermined depth 104 above the bottom surface 102 of the semiconductor substrate 101. This predetermined depth 104 should be at least equal to the desired thickness of the semiconductor substrate 101 in the resulting semiconductor chip 100A, 100B, 100C.

This process 412 of forming the dual damascene structure 120 can further comprise forming dielectric spacers 128 in the trench 123 and via opening 124 such that they are positioned laterally adjacent to and cover the vertical sidewalls of both the second via opening 124 and the trench 123 from the bottom surface 102 of the semiconductor substrate 101 to the top surface of the second dielectric layer 112. These dielectric spacers 128 can be formed, for example, by depositing a conformal layer of dielectric spacer material (e.g., a layer of silicon dioxide ($SiO_2$), silicon nitride (SiN), silicon oxynitride (SiON), or any other dielectric spacer material suitable for wire and via insulation) such that the dielectric spacer material lines the trench 123 and via opening 124. Then, an anisotropic etch process can be performed in order to remove the dielectric spacer material, as well as any dielectric cap layer 113 material (i.e., any exposed portion of the dielectric cap layer 113), from the horizontal surfaces of the trench 123, thereby exposing the first via 116.

Optionally, after the dielectric spacers 128 are formed, the trench 123 and via opening 124 can be lined with one or more conformal layers 126. These conformal layers 126 can comprise, for example, any of the following: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) or tungsten (W) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) or tungsten (W) seed layer, to the barrier layer) and a metal seed layer (e.g., a copper (Cu) seed layer or tungsten (W) seed layer) that facilitates electrodeposition of the metal layer 125 that fills the trench 123 and via opening 124.

A single metal layer 125 (e.g., a copper (Cu) layer, a tungsten (W) layer, an aluminum (Al) layer, a cobalt (Co) layer, a gold (Au) layer, a silver (Ag) layer or any other suitable metal layer) can be deposited (e.g., by electrodeposition) so as to fill the via opening 124, thereby forming the insulated second via 122 (i.e., the insulated through-substrate via (TSV)), and further so as to fill the trench 123, thereby forming the insulated wire 121 such that the insulated wire 121 electrically connects the first via 116 and the insulated second via 122.

Subsequently, additional back end of the line (BEOL) processing can be performed to complete the dual damascene structure 120 and the semiconductor chip 100A, 100B, 100C (414). This additional BEOL processing can comprise, for example, forming upper metal level vias and/or wires and forming solder pad(s) above the upper metal levels. Those skilled in the art will recognize that solder pad(s) above the metal levels will allow for electrical connections (e.g., controlled collapsed chip connections (C4 connections) to higher chips in a stacked-chip module.

This additional BEOL processing can also comprise thinning the semiconductor substrate 101 (e.g., by grinding, polishing and/or etching the bottom surface 102) to expose the insulated second via 122 (i.e., the insulated TSV) at the bottom surface 102 of the semiconductor substrate 101. This thinning process can comprise removing any exposed conformal liner 126 material (e.g., the barrier layer, adhesion layer and/or metal seed layer) in order to further expose the metal layer 125 contained in the insulated second via 122. Optionally, the bottom surface 102 of the semiconductor substrate 101 can be etched back such that outer sidewalls of the dielectric spacers 128 are exposed (i.e., such that the insulated second via 122 extends below the bottom surface 102 of the semiconductor substrate 101). Next, an insulator layer 195 (e.g., a silicon dioxide ($SiO_2$), layer, a silicon nitride (SiN) layer, a silicon oxynitride (SiON) layer or any other suitable insulator layer) can be formed on the bottom surface 102 of the semiconductor substrate 101 and an opening can be formed in the insulator layer 195 to expose the insulated second via 122 (e.g., using lithographically patterning and etching techniques or chemical mechanical polishing techniques). Subsequently, a contact pad 190 (e.g., a metal pad, such as a copper (Cu) pad or any other suitable metal pad) can be formed on (i.e., aligned with and immediately adjacent) to the insulated second via 122 so as to allow for electrical connection (e.g., controlled collapsed chip connection (C4 connection)) to a lower chip or a chip carrier in a stacked-chip module.

It should be noted that in each of the semiconductor chips 100A, 100B and 100C, formed as described above, the via opening 124 can be patterned and etched at process 412 so that the resulting insulated TSV has a simple polygon shape, such as a rectangular shape (e.g., as shown in the horizontal cross-section A-A' of FIG. 2A) or a circular shape (e.g., as shown in the horizontal cross-section A-A' of FIG. 2B). Alternatively, although not fully illustrated in FIGS. 1A-1C, the via opening 124 can be patterned and etched at process 412 so that the resulting TSV has a ring shape that is annular with respect to a column of stacked dielectric and substrate materials, such as a rectangular ring shape (e.g., as shown in the horizontal cross-section of FIG. 3A) or a circular ring shape (e.g., as shown in the horizontal cross-section of FIG. 3B).

Figure 5:
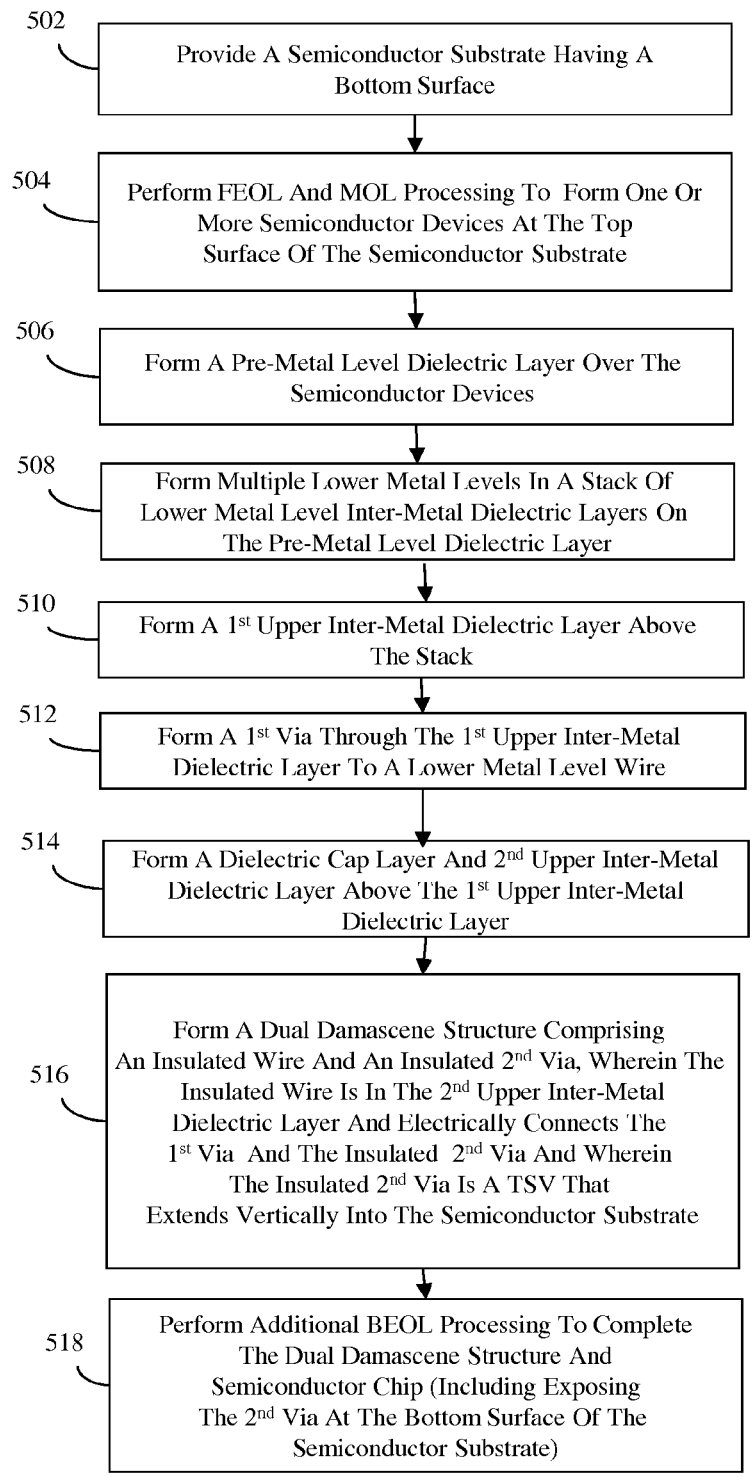
FIG. 5 is a flow diagram illustrating in greater detail a method of forming a semiconductor chip such as the semiconductor chip of FIG. 1A or FIG. 1B.

The following is a more detailed discussion of the method used to form a semiconductor chip, such as the semiconductor chip 100A of FIG. 1A or the semiconductor chip 100B of FIG. 1B. Referring to FIG. 5, the method of forming the semiconductor chip 100A of FIG. 1A or the semiconductor chip 100B of FIG. 1B can comprise providing a semiconductor substrate 101 having a bottom surface 102 and a top surface 103 opposite the bottom surface (502). This semiconductor substrate 101 can comprise a bulk semiconductor substrate (e.g., a bulk silicon (Si) substrate) or, alternatively, can comprise a semiconductor-on-insulator (SOI) substrate (e.g., a silicon-on-insulator substrate) or any other suitable semiconductor substrate.

Figure 6:
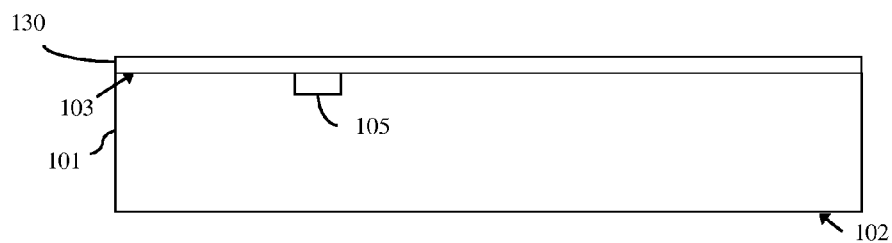
FIG. 6 is a cross-section diagram illustrating a partially completed semiconductor chip formed according to the flow diagram of FIG. 5.

The method can further comprise performing front end of the line (FEOL) and middle of the line (MOL) processing so as to form one or more semiconductor devices 105 (e.g., field effect transistors, bipolar transistors, capacitors, or any other type of semiconductor device) at the top surface 103 of the semiconductor substrate 101 (504, see FIG. 6).

Following device formation at process 504, a pre-metal level dielectric layer 130 can be formed on the semiconductor device(s) 105 (506, see FIG. 6). For purposes of this disclosure, a pre-metal level dielectric layer refers to a below metal level dielectric layer that isolates metal level wires from the devices 105 on the semiconductor substrate 101. Such a pre-metal level dielectric layer 130 can comprise, for example, a silicon dioxide ($SiO_2$).

Figure 7:
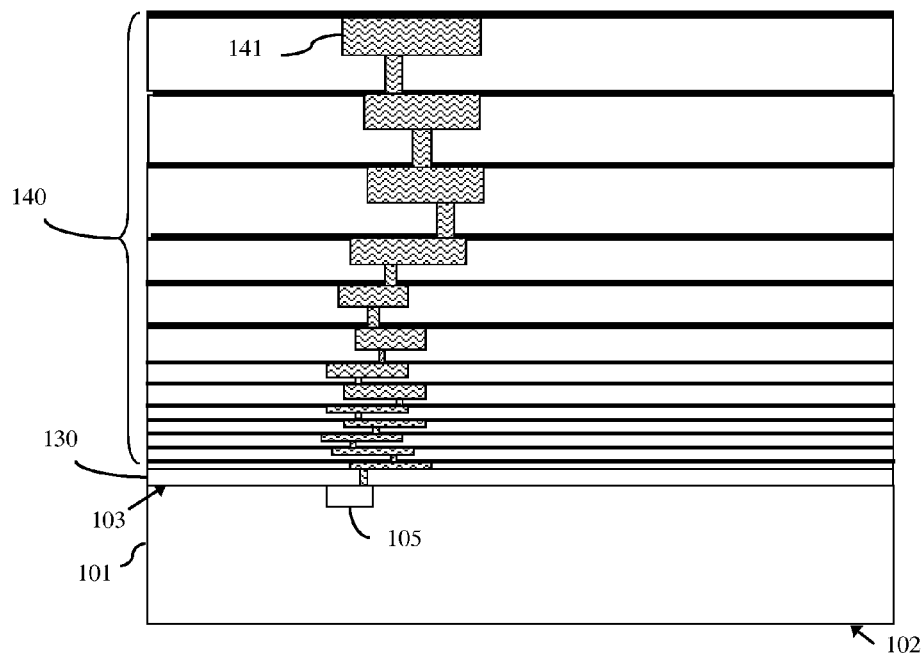
FIG. 7 is a cross-section diagram illustrating a partially completed semiconductor chip formed according to the flow diagram of FIG. 5.

Then, multiple lower metal levels, including at least one lower metal level wire 141, can be formed in a stack 140 of lower metal level inter-metal level dielectric layers above the pre-metal level dielectric layer 130 (508, see FIG. 7). For purposes of this disclosure, an inter-metal level dielectric (IMD) layer refers to a back end of the line (BEOL) dielectric layer, which is in a metal level above the semiconductor substrate 101 and which electrically isolates metal level vias and/or wires contained therein from other metal level vias and/or wires. The inter-metal level dielectric layers can comprise, for example, one or more layers of the following alone and/or in combination: silicon dioxide ($SiO_2$), a silicon nitride (SiN), borophosphosilicate glass (BPSG), tetraethyl orthosilicate (TEOS), and fluorinated tetraethyl orthosilicate (FTEOS).

Figure 8:
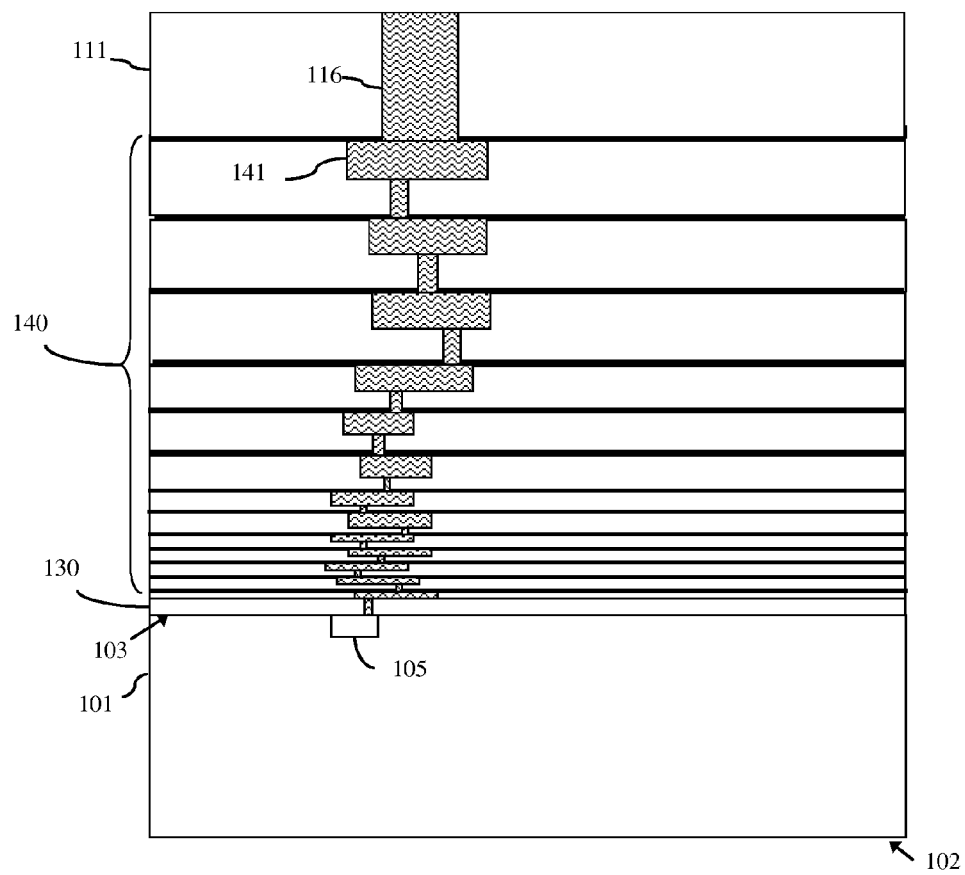
FIG. 8 is a cross-section diagram illustrating a partially completed semiconductor chip formed according to the flow diagram of FIG. 5.

Subsequently, the method can comprise forming (e.g., depositing) a first upper inter-metal level dielectric layer 111 above the stack 140 (510). Then, a first via 116 can be formed that extends vertically through the first upper inter-metal level dielectric layer 111 to the lower metal level wire 141 (512, see FIG. 8). Specifically, this first via 116 can be formed by first using, for example, conventional lithographic patterning and etch techniques to form a via opening that extends vertically through the first dielectric layer 111 to the lower metal level wire 141. This via opening can be filled with a metal layer (e.g., a copper (Cu) layer) using, for example, an electrodeposition process. Optionally, prior to the metal layer electrodeposition process, this via opening can be lined with one or more of the following conformal layers: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) seed layer, to the barrier layer) and a metal seed layer (e.g., a copper (Cu) seed layer) that facilitates electrodeposition of the metal layer that fills the first via 116.

Figure 9:
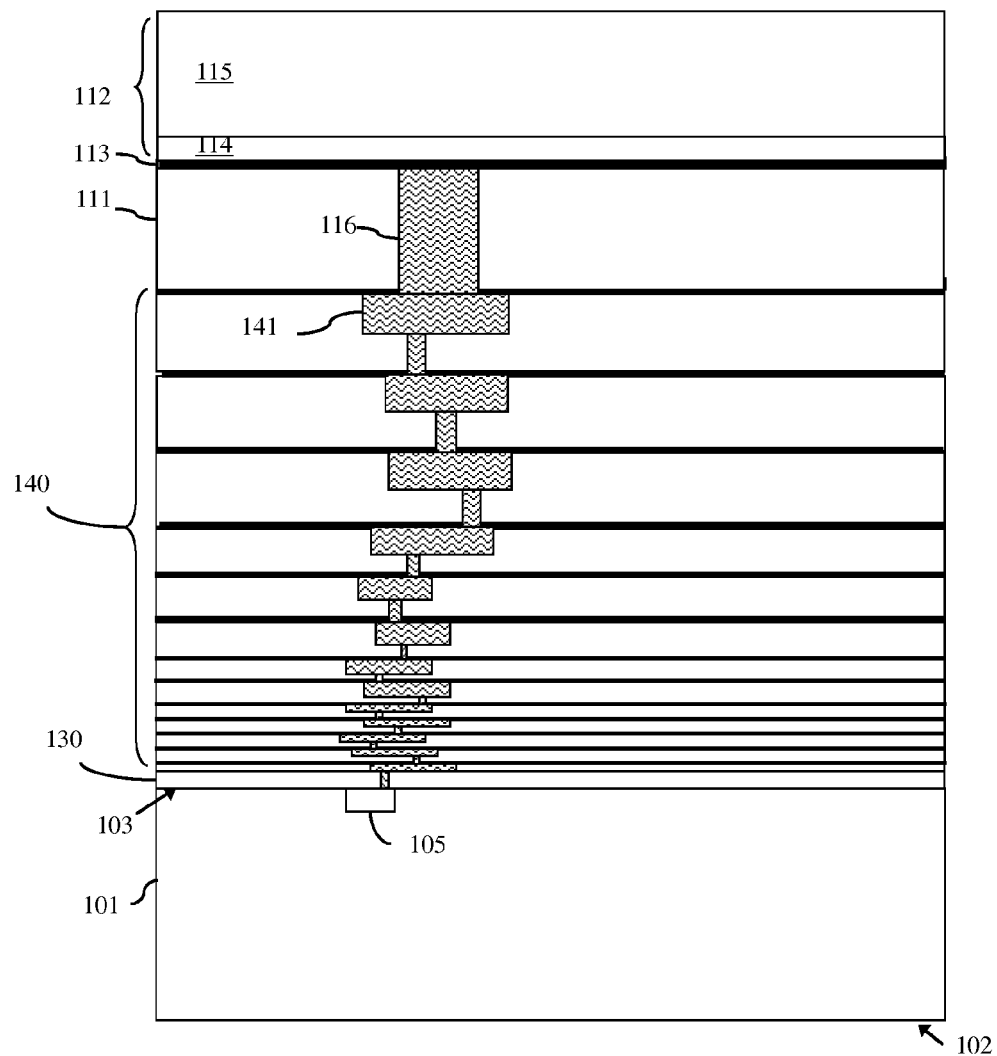
FIG. 9 is a cross-section diagram illustrating a partially completed semiconductor chip formed according to the flow diagram of FIG. 5.

Then, an optional dielectric cap layer 113 (e.g., a silicon nitride (SiN) layer) and a second upper inter-metal level dielectric layer 112 can be formed (e.g., deposited) above the first upper inter-metal level dielectric layer 111 (514, see FIG. 9). The second upper inter-metal level dielectric layer 112 can, for example, be deposited so as to have a lower portion 114 comprising tetraethyl orthosilicate (TEOS) and an upper portion 115 above the lower portion and comprising fluorinated tetraethyl orthosilicate (FTEOS).

The method can further comprise forming a dual damascene structure 120 comprising an insulated wire 121 in the second upper inter-metal level dielectric layer 112 and an insulated second via 122 and, particularly, an insulated through-substrate via (TSV) that extends vertically from the insulated wire 121 to the bottom surface 102 of the semiconductor substrate 101 (516).

Figure 10:
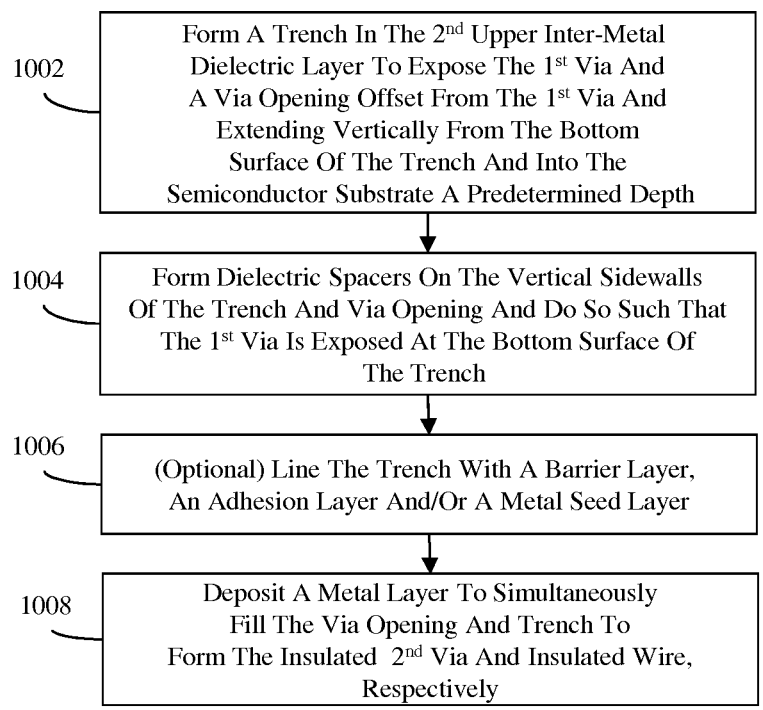
FIG. 10 is a flow diagram further detailing the process 516 of FIG. 5.
Figure 11:
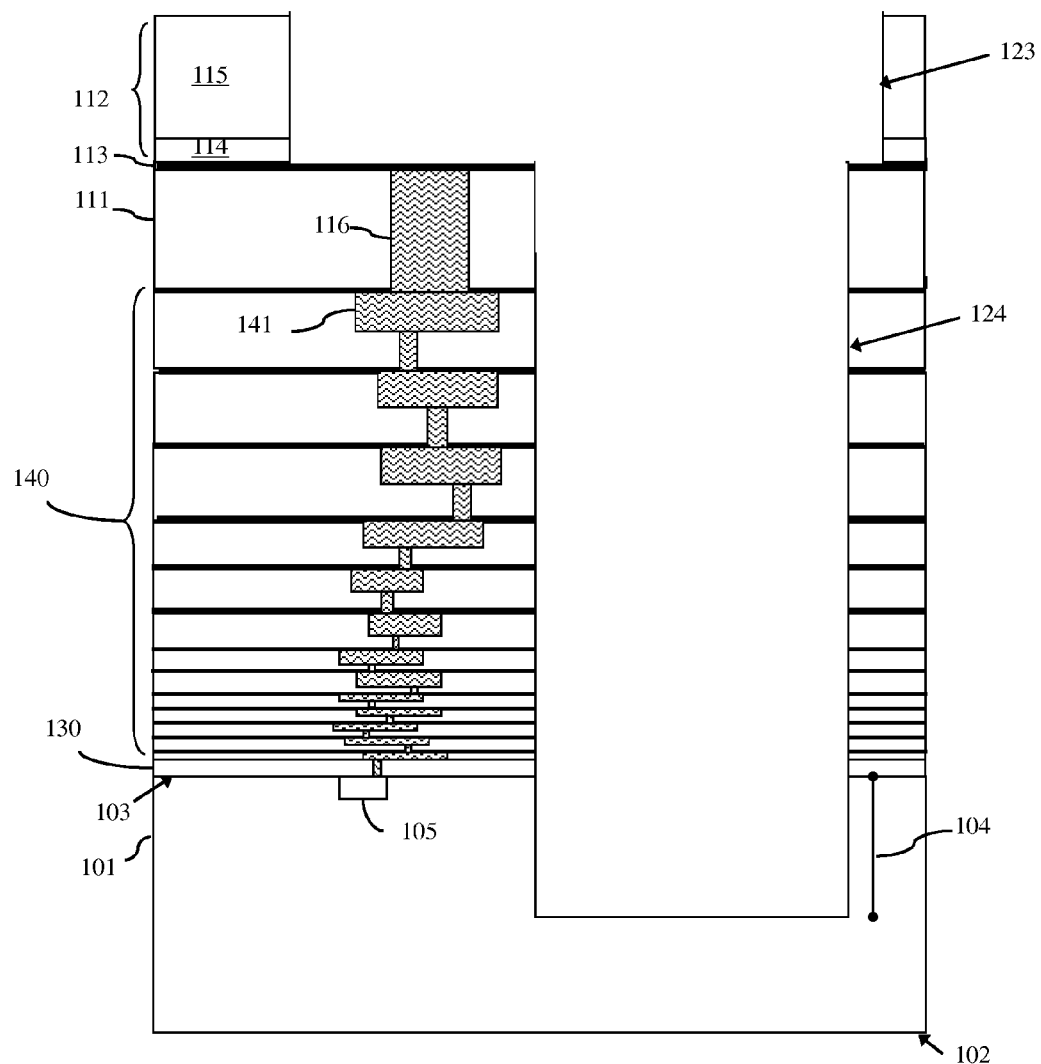
FIG. 11 is a cross-section diagram illustrating a partially completed semiconductor chip formed according to the flow diagram of FIG. 10.

FIG. 10 is a flow diagram further detailing the process 516 of forming the dual damascene structure 120 for the semiconductor chip 100A of FIG. 1A or for the semiconductor chip 100B of FIG. 1B. Specifically, conventional lithographic patterning and etching processes can be used to form a trench 123, which extends vertically through the second dielectric layer 112 to the first via 116 and which is relatively wide as compared to the first via 116, and to further form a via opening 124 that is offset from the first via 116 (e.g., that is parallel to and physically separated from the first via 116) and that extends vertically from the bottom surface of the trench 123 through the first dielectric layer 111, through any other dielectric layer(s) between the semiconductor substrate 101 and the first dielectric layer 111 (see detailed discussion below) and into the semiconductor substrate 101 to some predetermined depth 104 above the bottom surface 102 of the semiconductor substrate 101 (1002, see FIG. 11). This predetermined depth 104 should be at least equal to the desired thickness of the semiconductor substrate 101 in the resulting semiconductor chip 100A or 100B. Those skilled in the art will recognize that order within which the trench and via opening are patterned and etched may vary.

Figure 12:
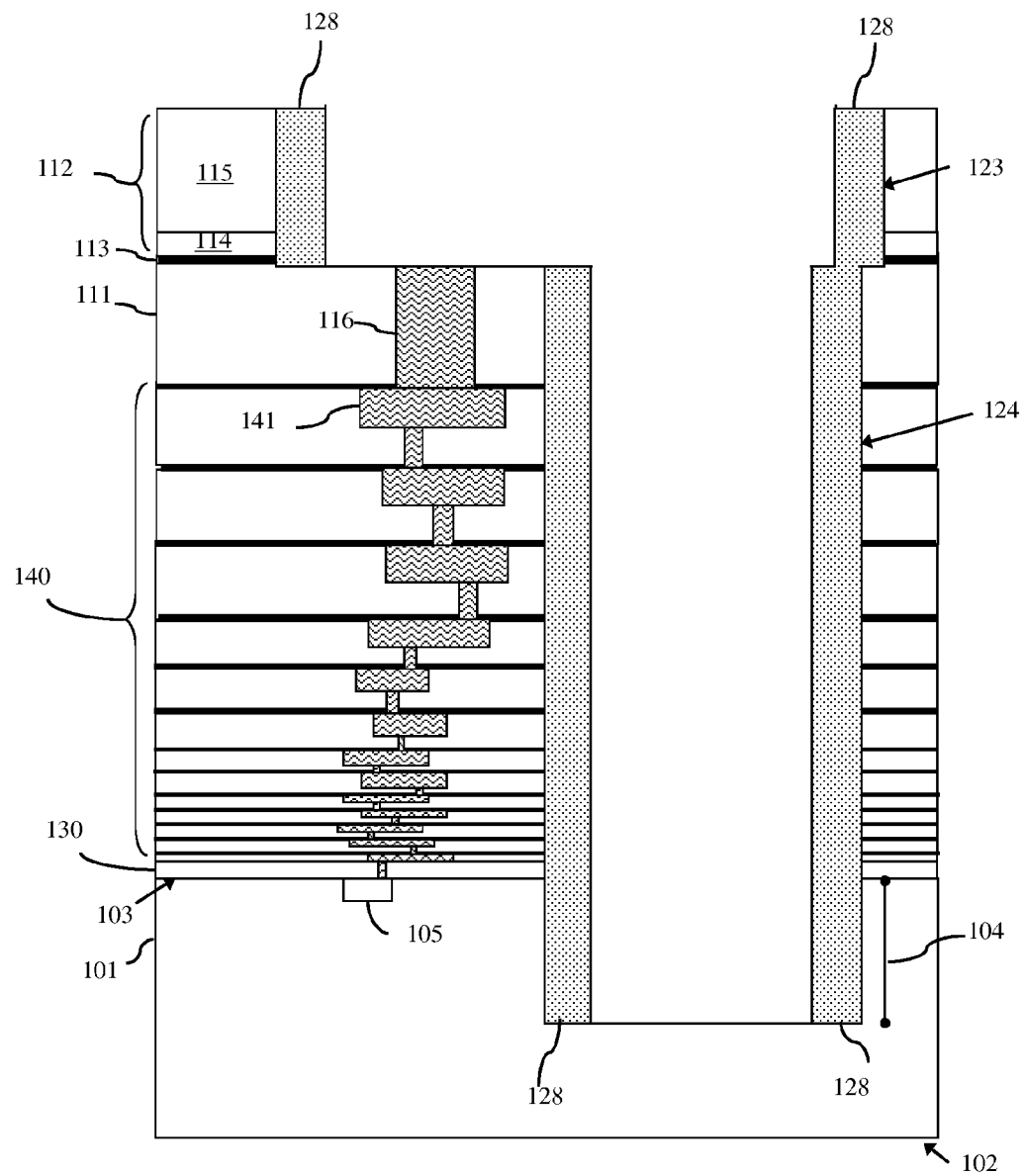
FIG. 12 is a cross-section diagram illustrating a partially completed semiconductor chip formed according to the flow diagram of FIG. 10.

Next, dielectric spacers 128 can be formed in the trench 123 and via opening 124 such that they are positioned laterally adjacent to and cover the vertical sidewalls of both the second via opening 124 and the trench 123 from the bottom surface 102 of the semiconductor substrate 101 to the top surface of the second dielectric layer 112 (1004, see FIG. 12). These dielectric spacers 128 can be formed, for example, by depositing a conformal layer of dielectric spacer material (e.g., a layer of silicon dioxide (SiO$_2$), silicon nitride (SiN), silicon oxynitride (SiON), or any other dielectric spacer material suitable for wire and via insulation) such that the dielectric spacer material lines the trench 123 and via opening 124. Then, an anisotropic etch process can be performed in order to remove the dielectric spacer material, as well as any dielectric cap 113 material, from the horizontal surfaces of the trench 123, thereby exposing the first via 116.

Figure 13:
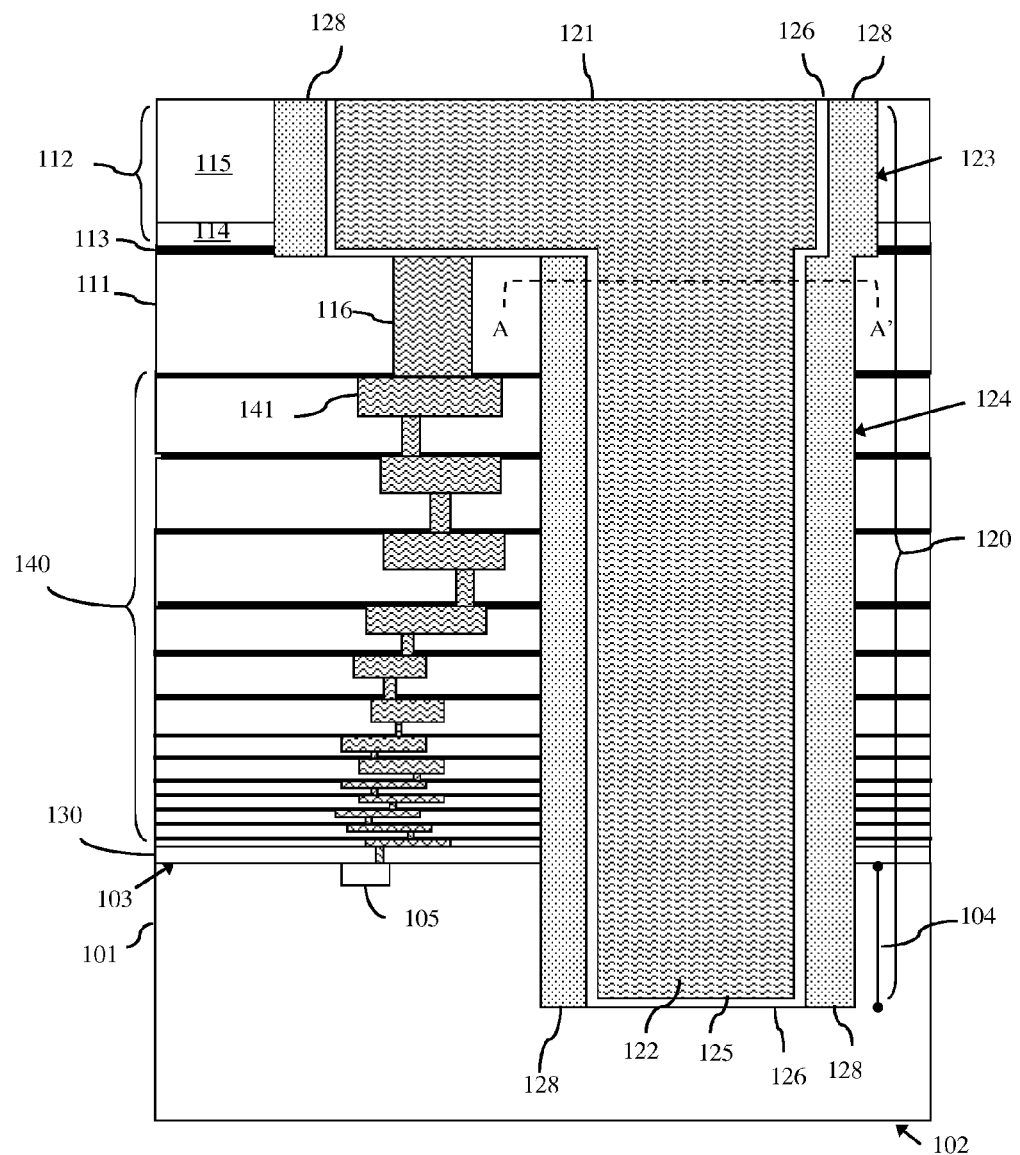
FIG. 13 is a cross-section diagram illustrating a partially completed semiconductor chip formed according to the flow diagram of FIG. 10.

Optionally, after the dielectric spacers 128 are formed, the trench 123 and via opening 124 can be lined with one or more conformal layers 126 (1006, see FIG. 13). These conformal layers 126 can comprise, for example, any of the following: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) or tungsten (W) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) or tungsten (W) seed layer, to the barrier layer) and a metal seed layer (e.g., a copper (Cu) seed layer or tungsten (W) seed layer) that facilitates electrodeposition of the metal layer 125 that fills the trench 123 and via opening 124. Then, a single metal layer 125 (e.g., a copper (Cu) layer, a tungsten (W) layer, an aluminum (Al) layer, a cobalt (Co) layer, a gold (Au) layer, a silver (Ag) layer or any other suitable metal layer) can be deposited (e.g., by electrodeposition) so as to fill the via opening 124, thereby forming the insulated second via 122 (i.e., the insulated through-substrate via (TSV)), and further so as to fill the trench 123, thereby forming the insulated wire 121 such that the insulated wire 121 electrically connects the first via 116 and the insulated second via 122 (1008, see FIG. 13). Following electrodeposition of the metal layer 125 and chemical mechanical polishing process can be performed.

It should be noted that in each of the semiconductor chips 100A and 100B, formed as described above, the via opening 124 can be patterned and etched at process 1004 so that the resulting insulated TSV has a simple polygon shape, such as a rectangular shape (e.g., as shown in the horizontal cross-section A-A' of FIG. 2A) or a circular shape (e.g., as shown in the horizontal cross-section A-A' of FIG. 2B). Alternatively, although not fully illustrated in FIGS. 1A-1C, the via opening 124 can be patterned and etched at process 1004 so that the resulting TSV has a ring shape that is annular with respect to a column of stacked dielectric and substrate materials, such as a rectangular ring shape (e.g., as shown in the horizontal cross-section of FIG. 3A) or a circular ring shape (e.g., as shown in the horizontal cross-section of FIG. 3B).

Referring again to FIG. 5, the method can further performing additional back end of the line (BEOL) processing to complete the dual damascene structure 120 and the semiconductor chip 100A or 100B (518). Specifically, for the semiconductor chip 100A of FIG. 1A, the additional BEOL processing 518 can comprise forming an additional dielectric cap layer 152 and a third upper inter-metal level dielectric layer 150 on the second upper inter-metal level dielectric layer 112 above the dual damascene structure 120, forming a third via 151 that extends vertically through the third upper inter-metal level dielectric layer 150 to the insulated wire 121, and forming a solder pad 155 (e.g., a metal pad, such as a copper (Cu) pad or any other suitable metal pad) for a controlled collapsed chip connection on the third upper inter-metal level dielectric layer 150 immediately adjacent to the third via 151. For the semiconductor chip 100B of FIG. 1B, the additional BEOL processing 518 can similarly comprise forming an additional dielectric cap layer 152 and a third upper inter-metal level dielectric layer 150 on the second upper inter-metal level dielectric layer 112 above the dual damascene structure 120 and forming a third via 151 that extends vertically through the third upper inter-metal level dielectric layer 150 to the insulated wire 121. Then, an upper metal level wire 153 can be formed on the third upper inter-metal level dielectric layer 150 immediately adjacent to the third via 151. Formation of this upper metal level wire 153 can be followed by the formation of additional upper metal level vias and/or wires, if necessary, and the formation of solder pad(s) above the metal levels (not shown). As discussed above, solder pad(s) above the metal levels will allow for electrical connections (e.g., controlled collapsed chip connections (C4 connections) to higher chips in a stacked-chip module.

In either case, this additional BEOL processing 518 can also comprise thinning the semiconductor substrate 101 (e.g., by grinding, polishing and/or etching the bottom surface 102) to expose the insulated second via 122 (i.e., the insulated TSV) at the bottom surface 102 of the semiconductor substrate 101. This thinning process can comprise removing any exposed conformal liner 126 material (e.g., the barrier layer, adhesion layer and/or metal seed layer) in order to further expose the metal layer 125 contained in the insulated second via 122. Optionally, the bottom surface 102 of the semiconductor substrate 101 can be etched back such that outer sidewalls of the dielectric spacers 128 are exposed (i.e., such that the insulated second via 122 extends below the bottom surface 102 of the semiconductor substrate 101). Next, an insulator layer 195 (e.g., a silicon dioxide ($SiO_2$) layer, a silicon nitride (SiN) layer, a silicon oxynitride (SiON) layer or any other suitable insulator layer) can be formed on the bottom surface 102 of the semiconductor substrate 101 and an opening can be formed in the insulator layer 195 to expose the insulated second via 122 (e.g., using lithographically patterning and etching techniques or chemical mechanical polishing techniques). Subsequently, a contact pad 190 (e.g., a metal pad, such as a copper (Cu) pad or any other suitable metal pad) can be formed on (i.e., aligned with and immediately adjacent) to the insulated second via 122 so as to allow for electrical connection (e.g., controlled collapsed chip connection (C4 connection)) to a lower chip or a chip carrier in a stacked-chip module.

Figure 14:
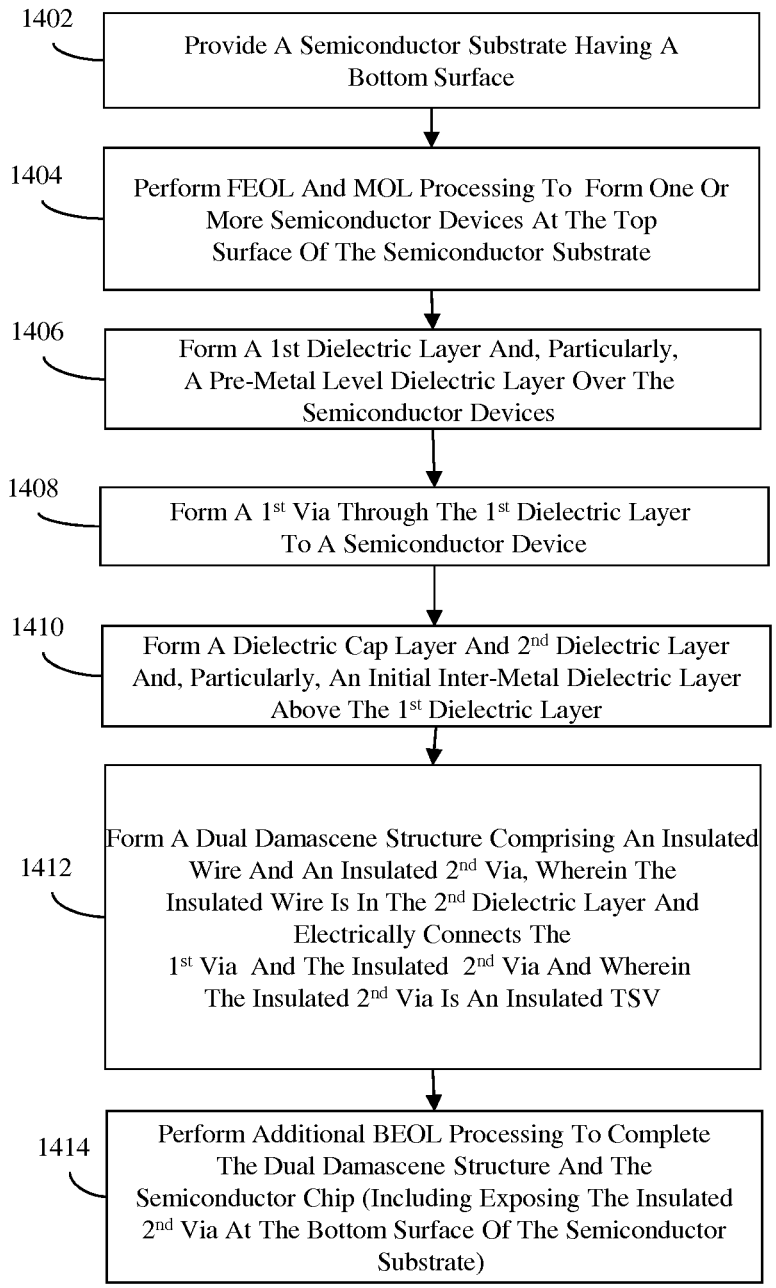
FIG. 14 is a flow diagram illustrating in greater detail a method of forming a semiconductor chip such as the semiconductor chip of FIG. 1C.

The following is a more detailed discussion of the method used to form a semiconductor chip, such as the semiconductor chip 100C of FIG. 1C. Referring to FIG. 14, the method of forming the semiconductor chip 100C of FIG. 1C can comprise providing a semiconductor substrate 101 having a bottom surface 102 and a top surface 103 opposite the bottom surface (1402). This semiconductor substrate 101 can comprise a bulk semiconductor substrate (e.g., a bulk silicon (Si) substrate) or, alternatively, can comprise a semiconductor-on-insulator (SOI) substrate (e.g., a silicon-on-insulator substrate) or any other suitable semiconductor substrate.

Figure 15:
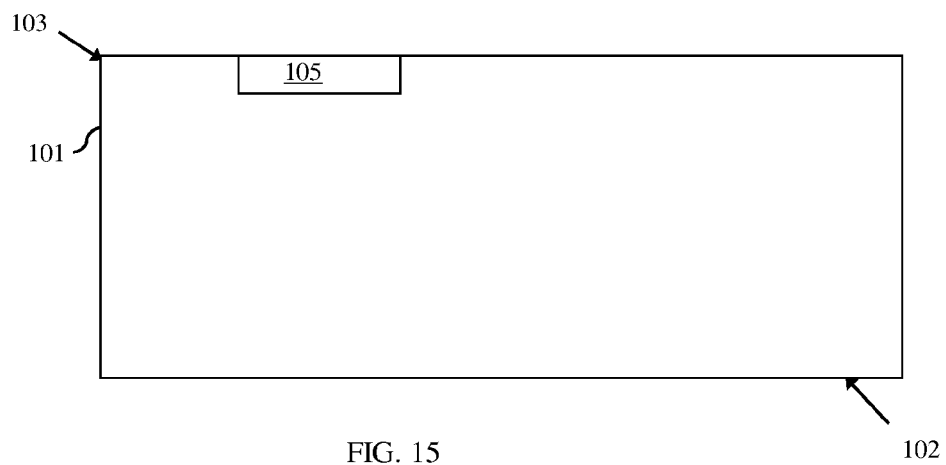
FIG. 15 is a cross-section diagram illustrating a partially completed semiconductor chip formed according to the flow diagram of FIG. 14.

The method can further comprise performing front end of the line (FEOL) and middle of the line (MOL) processing so as to form one or more semiconductor devices 105 (e.g., field effect transistors, bipolar transistors, capacitors, or any other type of semiconductor device) at the top surface 103 of the semiconductor substrate 101 (1404, see FIG. 15).

Figure 16:
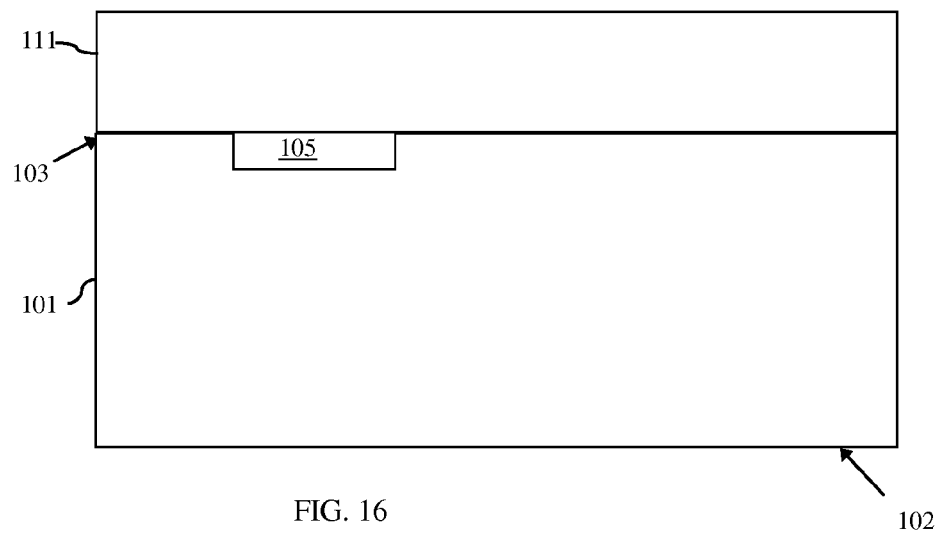
FIG. 16 is a cross-section diagram illustrating a partially completed semiconductor chip formed according to the flow diagram of FIG. 14.
Figure 17:
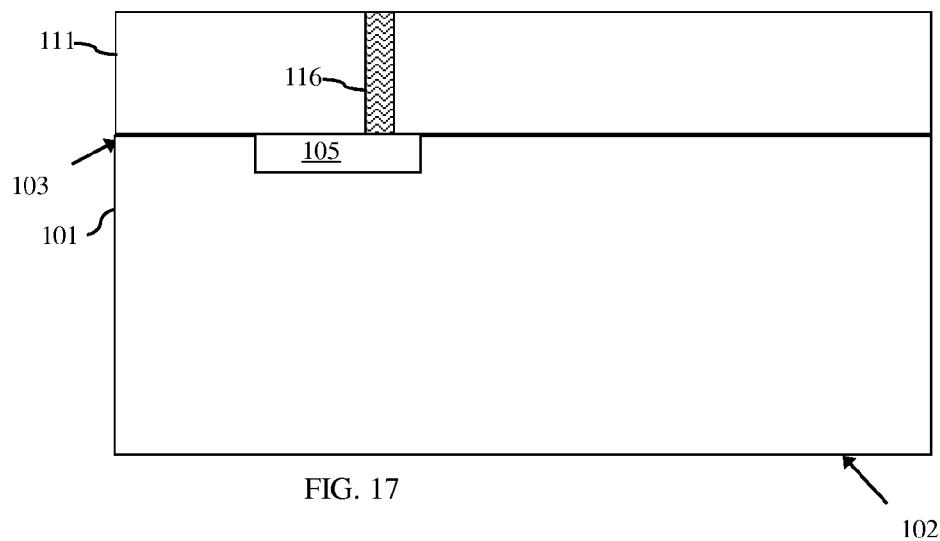
FIG. 17 is a cross-section diagram illustrating a partially completed semiconductor chip formed according to the flow diagram of FIG. 14.

Following device formation at process 1404, a first dielectric layer 111 and, particularly, a pre-metal level dielectric layer can be formed on the semiconductor device(s) 105 (1406, see FIG. 16). For purposes of this disclosure, a pre-metal level dielectric layer refers to a below metal level dielectric layer that isolates metal level wires from the devices 105 on the semiconductor substrate 101. Such a pre-metal level dielectric layer 130 can comprise, for example, a silicon dioxide ($SiO_2$). Then, a first via 116 can be formed that extends vertically through the first dielectric layer 111 to a semiconductor device 105 (1408, see FIG. 17). Specifically, this first via 116 can be formed by first using, for example, conventional lithographic patterning and etch techniques to form a via opening that extends vertically through the first dielectric layer 111 to the semiconductor device 105. This via opening can be filled with a metal layer (e.g., a copper (Cu) layer) using, for example, an electrodeposition process. Optionally, prior to the metal layer electrodeposition process, this via opening can be lined with one or more of the following conformal layers: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) seed layer, to the barrier layer) and a metal seed layer (e.g., a copper (Cu) seed layer) that facilitates electrodeposition of the metal layer that fills the first via 116.

Figure 18:
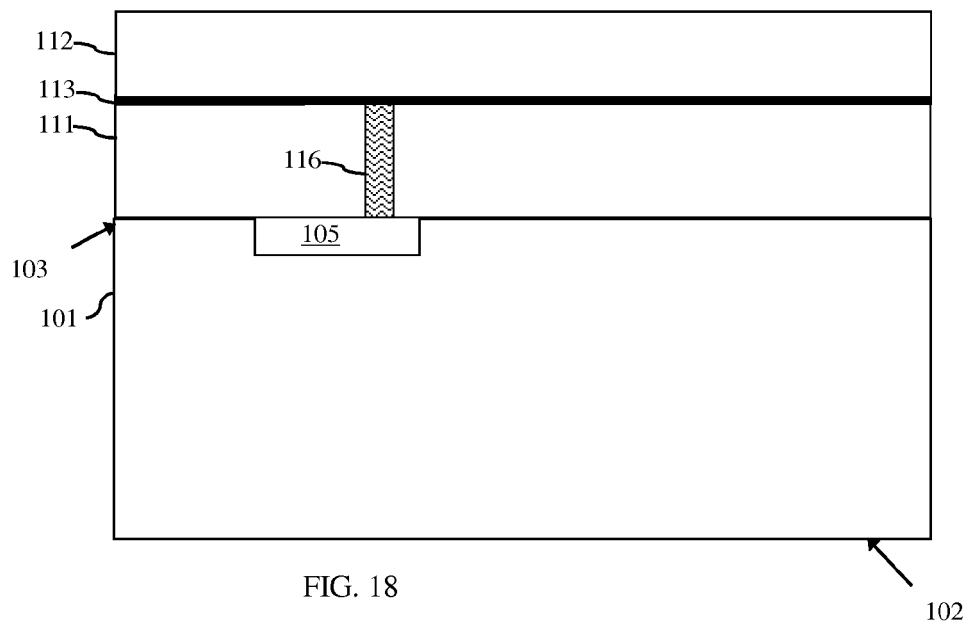
FIG. 18 is a cross-section diagram illustrating a partially completed semiconductor chip formed according to the flow diagram of FIG. 14.
Figure 19:
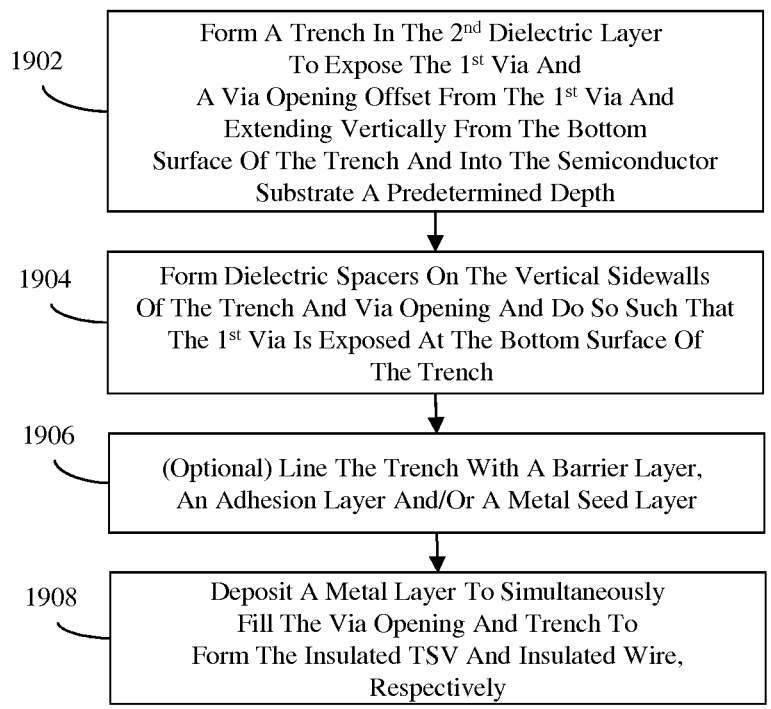
FIG. 19 is a flow diagram further detailing the process 1412 of FIG. 14.

Then, an optional dielectric cap layer 113 (e.g., a silicon nitride (SiN) layer) and a second dielectric layer 112 and, particularly, an initial inter-metal level dielectric layer can be formed (e.g., deposited) above the first dielectric layer 111 (1410, see FIG. 18).

The method can further comprise forming a dual damascene structure 120 comprising an insulated wire 121 in the second dielectric layer 112 and an insulated second via 122 and, particularly, an insulated through-substrate via (TSV) that extends vertically from the insulated wire 121 to the bottom surface 102 of the semiconductor substrate 101 (1412).

Figure 20:
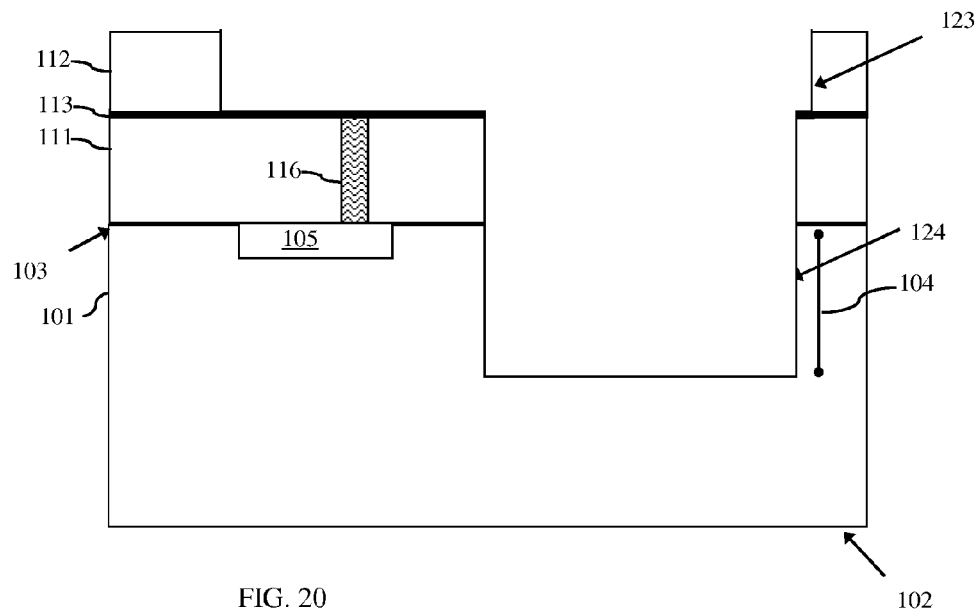
FIG. 20 is a cross-section diagram illustrating a partially completed semiconductor chip formed according to the flow diagram of FIG. 19.

FIG. 10 is a flow diagram further detailing the process 1412 of forming the dual damascene structure 120 for the semiconductor chip 100C of FIG. 1C. Specifically, conventional lithographic patterning and etching processes can be used to form a trench 123, which extends vertically through the second dielectric layer 112 to the first via 116 and which is relatively wide as compared to the first via 116, and to further form a via opening 124 that is offset from the first via 116 (e.g., that is parallel to and physically separated from the first via 116) and that extends vertically from the bottom surface of the trench 123 through the first dielectric layer 111 and into the semiconductor substrate 101 some predetermined depth above the bottom surface 102 of the semiconductor substrate 101 (1902, see FIG. 20). This predetermined depth 104 should be at least equal to the desired thickness of the semiconductor substrate 101 in the resulting semiconductor chip 100C. Those skilled in the art will recognize that order within which the trench and via opening are patterned and etched may vary.

Figure 21:
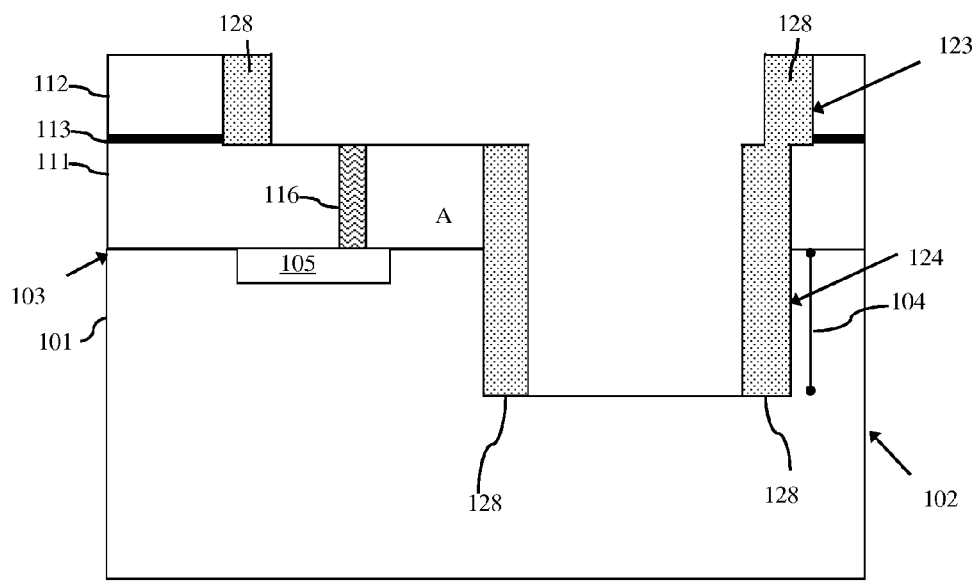
FIG. 21 is a cross-section diagram illustrating a partially completed semiconductor chip formed according to the flow diagram of FIG. 19; and, FIG. 22 is a cross-section diagram illustrating a partially completed semiconductor chip formed according to the flow diagram of FIG. 19.

Next, dielectric spacers 128 can be formed in the trench 123 and via opening 124 such that they are positioned laterally adjacent to and cover the vertical sidewalls of both the second via opening 124 and the trench 123 from the bottom surface 102 of the semiconductor substrate 101 to the top surface of the second dielectric layer 112 (1904, see FIG. 21). These dielectric spacers 128 can be formed, for example, by depositing a conformal layer of dielectric spacer material (e.g., a layer of silicon dioxide ($SiO_2$), silicon nitride (SiN), silicon oxynitride (SiON), or any other dielectric spacer material suitable for wire and via insulation) such that the dielectric spacer material lines the trench 123 and via opening 124. Then, an anisotropic etch process can be performed in order to remove the dielectric spacer material, as well as any dielectric cap 113 material, from the horizontal surfaces of the trench 123, thereby exposing the first via 116.

Figure 22:
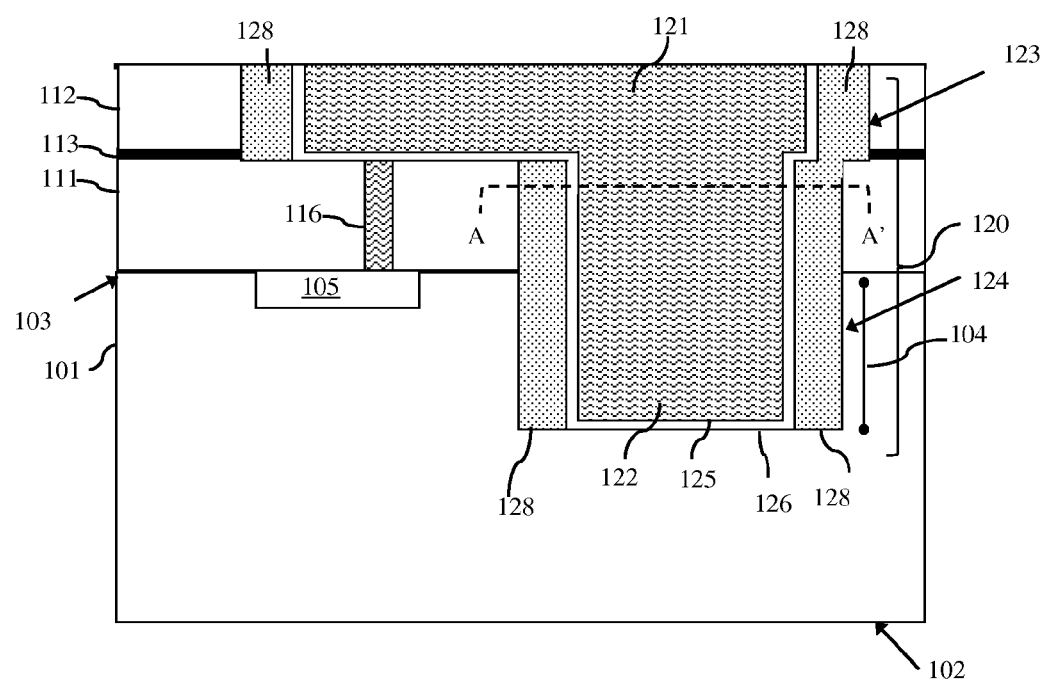

Optionally, after the dielectric spacers 128 are formed, the trench 123 and via opening 124 can be lined with one or more conformal layers 126 (1906, see FIG. 22). These conformal layers 126 can comprise, for example, any of the following: a barrier layer (e.g., a conformal layer of titanium (Ti), titanium nitride (TiN), titanium silicon nitride (TiSiN), tantalum (Ta), tantalum nitride (TaN), tantalum silicon nitride (TaSiN), tungsten (W), tungsten nitride (WN), tungsten silicon nitride (WSiN) or any other suitable metal or metal alloy layer that can prevent metal outdiffusion, such as copper (Cu) or tungsten (W) outdiffusion), an adhesion layer (e.g., a conformal layer of tantalum (Ta), ruthenium (Ru), a tantalum ruthenium (TaRu) alloy or any other suitable metal or metal alloy that promotes adhesion of a metal seed layer, such as a copper (Cu) or tungsten (W) seed layer, to the barrier layer) and a metal seed layer (e.g., a copper (Cu) seed layer, tungsten (W) seed layer or other suitable metal seed layer) that facilitates electrodeposition of the metal layer 125 that fills the trench 123 and via opening 124. Finally, a single metal layer 125 (e.g., a copper (Cu) layer, a tungsten (W) layer, an aluminum (Al) layer, a cobalt (Co) layer, a gold (Au) layer, a silver (Ag) layer or any other suitable metal layer) can be deposited (e.g., by electrodeposition) so as to fill the via opening 124, thereby forming the insulated second via 122 (i.e., the insulated through-substrate via (TSV)), and further so as to fill the trench 123, thereby forming the insulated wire 121 such that the insulated wire 121 electrically connects the first via 116 and the insulated second via 122 (1908, see FIG. 22). Following electrodeposition of the metal layer 125 and chemical mechanical polishing process can be performed.

It should be noted that in the semiconductor chip 100C, formed as described above, the via opening 124 can be patterned and etched at process 1904 so that the resulting insulated TSV has a simple polygon shape, such as a rectangular shape (e.g., as shown in the horizontal cross-section A-A' of FIG. 2A) or a circular shape (e.g., as shown in the horizontal cross-section A-A' of FIG. 2B). Alternatively, although not fully illustrated in FIGS. 1A-1C, the via opening 124 can be patterned and etched at process 1004 so that the resulting TSV has a ring shape that is annular with respect to a column of stacked dielectric and substrate materials, such as a rectangular ring shape (e.g., as shown in the horizontal cross-section of FIG. 3A) or a circular ring shape (e.g., as shown in the horizontal cross-section of FIG. 3B).

Referring again to FIG. 14, the method can further comprise performing additional back end of the line (BEOL) processing to complete the dual damascene structure 120 and the semiconductor chip 100C (1414). Specifically, this additional BEOL processing 1414 can comprise forming an additional dielectric cap layer 152 and a third dielectric layer 150 on the second dielectric layer 112 above the dual damascene structure 120 and forming a third via 151 that extends vertically through the third dielectric layer 150 to the insulated wire 12. Then, an upper metal level wire 153 can be formed on the third dielectric layer 150 immediately adjacent to the third via 151. Formation of this upper metal level wire 153 can be followed by the formation of additional upper metal level vias and/or wires and the formation of solder pad(s) above the metal levels (not shown). As discussed above, solder pad(s) above the metal levels will allow for electrical connections (e.g., controlled collapsed chip connections (C4 connections)) to higher chips in a stacked-chip module.

This additional BEOL processing 1414 can also comprise thinning the semiconductor substrate 101 (e.g., by grinding, polishing and/or etching the bottom surface 102) to expose the insulated second via 122 (i.e., the insulated TSV) at the bottom surface 102 of the semiconductor substrate 101. This thinning process can comprise removing any exposed conformal liner 126 material (e.g., the barrier layer, adhesion layer and/or metal seed layer) in order to further expose the metal layer 125 contained in the insulated second via 122. Optionally, the bottom surface 102 of the semiconductor substrate 101 can be etched back such that outer sidewalls of the dielectric spacers 128 are exposed (i.e., such that the insulated second via 122 extends below the bottom surface 102 of the semiconductor substrate 101). Next, an insulator layer 195 (e.g., a silicon dioxide layer, a silicon nitride layer, a silicon oxynitride layer or any other suitable insulator layer) can be formed on the bottom surface 102 of the semiconductor substrate 101 and an opening can be formed in the insulator layer 195 to expose the insulated second via 122 (e.g., using lithographically patterning and etching techniques or chemical mechanical polishing techniques). Subsequently, a contact pad 190 (e.g., a metal pad, such as a copper pad or any other suitable metal pad) can be formed on (i.e., aligned with and immediately adjacent) to the insulated second via 122 so as to allow for electrical connection (e.g., controlled collapsed chip connection (C4 connection)) to a lower chip or a chip carrier in a stacked-chip module.

It should be noted that the terminology used herein is for the purpose of describing the disclosed methods and structures and is not intended to be limiting. For example, as used herein, the singular forms "a", "an" and "the" are intended to include the plural forms as well, unless the context clearly indicates otherwise. As used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is a semiconductor chip having a dual damascene insulated wire and insulated through-substrate via (TSV) structure, which allows for integration into a stacked-chip module (i.e., into a three-dimensional (3D) chip stack). Also disclosed herein are methods of forming such a semiconductor chip. Specifically, the methods incorporate a dual damascene technique wherein a trench and via opening are formed in dielectric layers above a semiconductor substrate such that the trench is above a first via (e.g., to an on-chip device or lower metal level wire) and the via opening is positioned laterally adjacent to the first via and extends vertically from the bottom surface of the trench to the bottom surface of the semiconductor substrate. Dielectric spacers are formed on the vertical sidewalls of the trench and via opening. Then, a metal layer is deposited in order to simultaneously form an insulated wire in the trench and an insulated second via and, particularly, an insulated through-substrate via (TSV) in the via opening aligned below the trench. Thus, the insulated wire electrically connects the insulated TSV to the first via and, thereby to an on-chip device or lower metal level wire below. Additional back end of the line (BEOL) processing can be performed to complete the semiconductor chip. This additional BEOL processing can comprise, for example, upper metal level via and/or wire formation, solder pad formation for controlled collapsed chip connections (C4 connections), thinning the semiconductor substrate to expose the insulated TSV at the bottom surface, etc. By using such a dual damascene technique the costs and processing times associated with insulated TSV formation and, thereby semiconductor chip formation can be reduced.

What is claimed is:

1. A method of forming a semiconductor chip, said method comprising:
    providing a semiconductor substrate having a bottom surface;
    forming a first dielectric layer above said semiconductor substrate;
    forming a first via extending vertically through said first dielectric layer;
    forming a second dielectric layer above said first dielectric layer; and,
    forming a dual damascene structure comprising an insulated wire and an insulated second via, said insulated wire being in said second dielectric layer and electrically connecting said first via and said insulated second via and said insulated second via extending vertically from said insulated wire to said bottom surface.

2. The method of claim 1, said forming of said dual damascene structure comprising:
    forming a via opening and a trench such that said trench extends vertically through said second dielectric layer to said first via and such that said via opening is offset from said first via and extends vertically from said trench and into said semiconductor substrate;
    forming dielectric spacers on vertical sidewalls of said via opening and said trench;
    after said forming of said dielectric spacers, depositing a metal layer so as to fill said via opening to form said insulated second via and so as to further fill said trench to form said insulated wire electrically connecting said first via and said insulated second via; and,
    thinning said semiconductor substrate to expose said insulated second via at said bottom surface.

3. The method of claim 2, said via opening being lithographically patterned so as to have any of a circular shape, a circular ring shape, a rectangular shape and a rectangular ring shape.

4. The method of claim 2, said depositing of said metal layer comprising performing an electrodeposition process.

5. The method of claim 2, said forming of said dual damascene structure further comprising, after said forming of said dielectric spacers and before said depositing of said metal layer, lining said via opening and said trench with at least one of a barrier layer, an adhesion layer and a metal seed layer.

6. The method of claim 1, said first dielectric layer and said second dielectric layer comprising a first upper inter-metal level dielectric layer and a second upper inter-metal level dielectric above multiple lower metal levels in a stack of lower inter-metal level dielectric layers on said semiconductor substrate and said first via extending vertically to a lower metal level wire in said stack.

7. The method of claim 6, further comprising forming, above said dual damascene structure, a third upper inter-metal level dielectric layer, a third via extending vertically through said third upper inter-metal level dielectric layer to said insulated wire and any one of an upper metal level wire and a solder pad for a controlled collapsed chip connection on said third upper inter-metal level dielectric layer immediately adjacent to said third via.

8. The method of claim 1, said first dielectric layer comprising a pre-metal level dielectric layer and said first via comprising a device contact that extends vertically to a device on said semiconductor substrate.

9. A method of forming a semiconductor chip, said method comprising:
    providing a semiconductor substrate having a bottom surface;
    forming multiple lower metal levels in a stack of lower inter-metal level dielectric layers above said semiconductor substrate;
    forming a first upper inter-metal level dielectric layer on said stack;
    forming a first via extending vertically through said first upper inter-metal level dielectric layer to a lower metal level wire in said stack;
    forming a second upper inter-metal level dielectric layer above said first upper inter-metal level dielectric layer;
    forming a dual damascene structure comprising insulated wire and an insulated second via, said insulated wire being in said second upper inter-metal level dielectric layer and electrically connecting said first via and said insulated second via and said insulated second via extending vertically from said insulated wire and into said semiconductor substrate;
    forming, above said dual damascene structure, a third upper inter-metal level dielectric layer, a third via extending vertically through said third upper inter-metal level dielectric layer to said insulated wire and any one of a solder pad and an upper metal level wire on said third upper inter-metal level dielectric layer immediately adjacent to said third via; and,
    thinning said semiconductor substrate to expose said insulated second via at said bottom surface.

10. The method of claim 9, said forming of said dual damascene structure comprising:
    forming a via opening and a trench such that said trench extends vertically through said second upper inter-metal level dielectric layer to said first via and such that said via opening is offset from said first via and extends vertically from said trench and into said semiconductor substrate;
    forming dielectric spacers on vertical sidewalls of said via opening and said trench; and
    after said forming of said dielectric spacers, depositing a metal layer so as to fill said via opening to form said insulated second via and so as to further fill said trench to form said insulated wire electrically connecting said first via and said insulated second via.

11. The method of claim 10 said via opening being lithographically patterned so as to have any of a circular shape, a circular ring shape, a rectangular shape and a rectangular ring shape.

12. The method of claim 10,
    said method further comprising, before said forming of said second upper inter-metal level dielectric layer, forming a dielectric cap layer on said first upper inter-metal level dielectric layer, and
    said forming of said dual damascene structure further comprising, after said forming of said dielectric spacers, removing an exposed portion of said dielectric cap layer in said trench to expose said first via.

13. The method of claim 10, said depositing of said metal layer comprising performing an electrodeposition process.

14. The method of claim 10, said forming of said dual damascene structure further comprising, after said forming of said dielectric spacers and before said depositing of said metal layer, lining said trench and said via opening with at least one of a barrier layer, an adhesion layer and a metal seed layer.

\* \* \* \* \*